United States Patent
Fudeta et al.

(10) Patent No.: US 8,324,639 B2
(45) Date of Patent: Dec. 4, 2012

(54) NITRIDE SEMICONDUCTOR LIGHT EMITTING DEVICE

(75) Inventors: Mayuko Fudeta, Mihara (JP); Atsuo Tsunoda, Higashihiroshima (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 397 days.

(21) Appl. No.: 11/882,826

(22) Filed: Aug. 6, 2007

(65) Prior Publication Data

US 2008/0035949 A1  Feb. 14, 2008

(30) Foreign Application Priority Data

Aug. 11, 2006  (JP) ................................ 2006-220153
May 30, 2007  (JP) ................................ 2007-143705

(51) Int. Cl.
  *H01L 33/00* (2010.01)
(52) U.S. Cl. ....... 257/93; 257/98; 257/99; 257/E33.005; 257/E33.066
(58) Field of Classification Search .................... 257/93, 257/98, 99, E33.005, E33.066
  See application file for complete search history.

(56) References Cited

U.S. PATENT DOCUMENTS

| 6,329,676 | B1 | 12/2001 | Takayama et al. |
| 2002/0139987 | A1 | 10/2002 | Collins, III et al. |
| 2004/0235210 | A1 | 11/2004 | Tamura et al. |
| 2005/0173725 | A1 | 8/2005 | Kunisato et al. |
| 2006/0154390 | A1 | 7/2006 | Tran et al. |
| 2006/0231852 | A1 | 10/2006 | Kususe et al. |
| 2008/0064130 | A1 | 3/2008 | Kunisato et al. |
| 2008/0251808 | A1* | 10/2008 | Kususe et al. .................. 257/98 |

FOREIGN PATENT DOCUMENTS

| CN | 1652364 | 8/2005 |
| JP | 2000-277804 | 10/2000 |
| JP | 2004-95959 | 3/2004 |
| JP | 2004-281863 | 10/2004 |
| JP | 2005-12188 | 1/2005 |
| TW | 540169 | 7/2003 |
| TW | I221035 | 9/2004 |

* cited by examiner

*Primary Examiner* — Shouxiang Hu
(74) *Attorney, Agent, or Firm* — Morrison & Foerster LLP

(57) ABSTRACT

A nitride semiconductor light emitting device includes a conductive substrate, a first metal layer, a second conductivity-type semiconductor layer, an emission layer, and a first conductivity-type semiconductor layer in this order. The nitride semiconductor light emitting device additionally has an insulating layer covering at least side surfaces of the second conductivity-type semiconductor layer, the emission layer and the first conductivity-type semiconductor layer. A method of manufacturing the same is provided. The nitride semiconductor light emitting device may further include a second metal layer. Thus, a reliable nitride semiconductor light emitting device and a method of manufacturing the same are provided in which short-circuit at the PN junction portion and current leak is reduced as compared with the conventional examples.

6 Claims, 15 Drawing Sheets

FIG.4
(a)
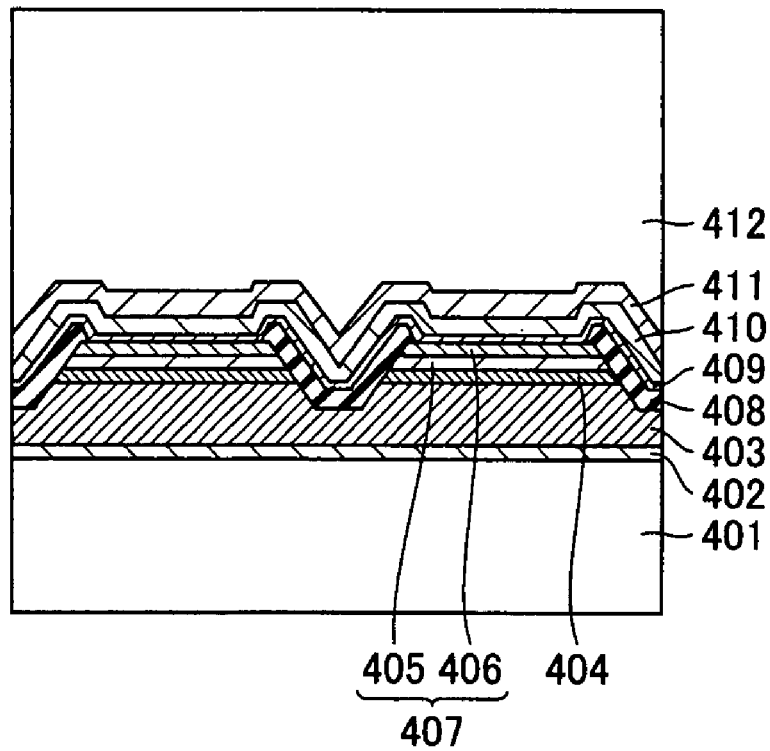
(b)
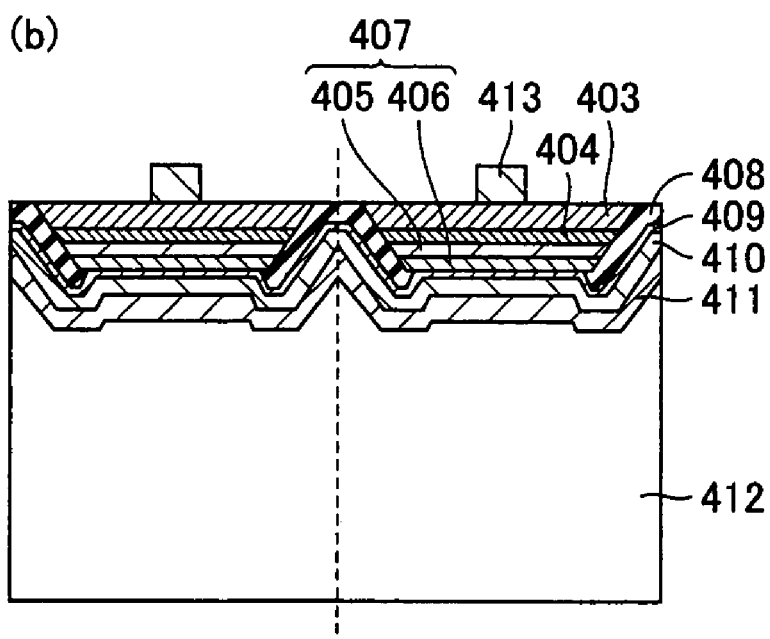

FIG.6
(a)
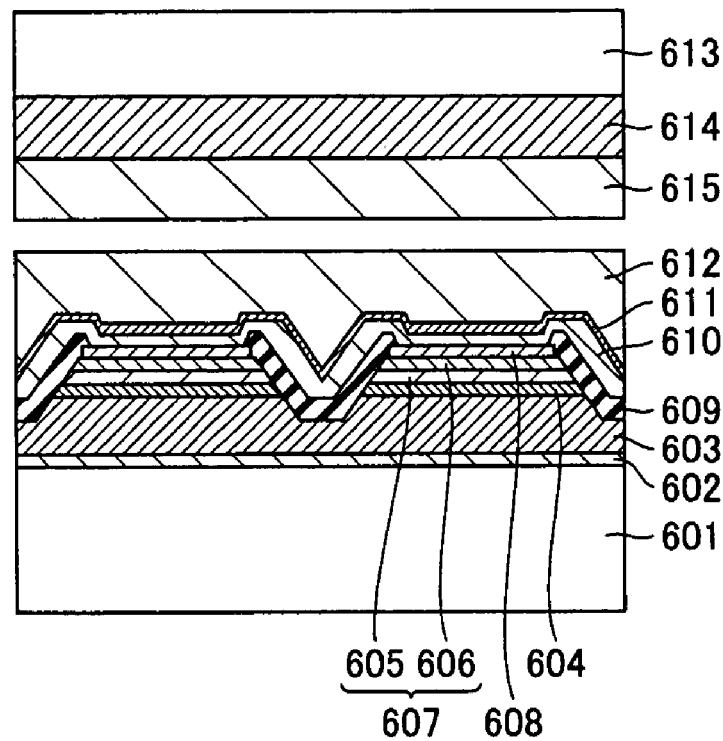
(b)
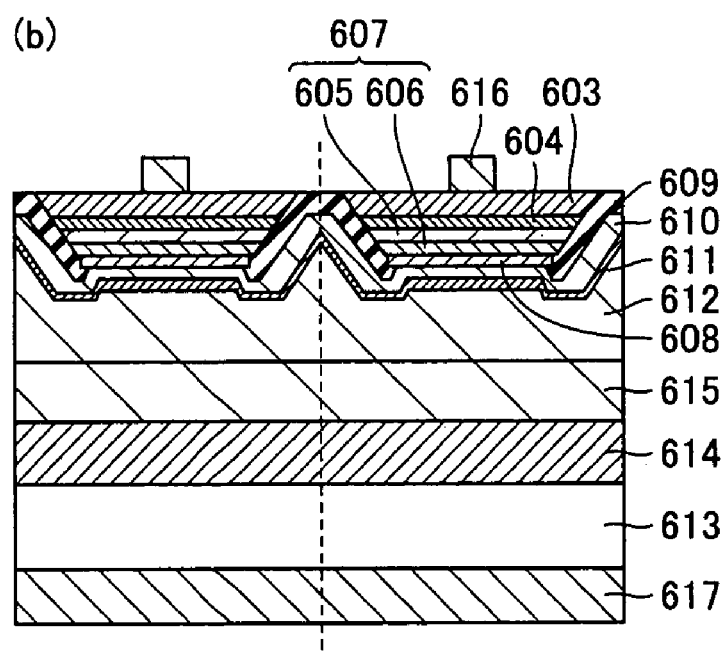

FIG.7
(a)
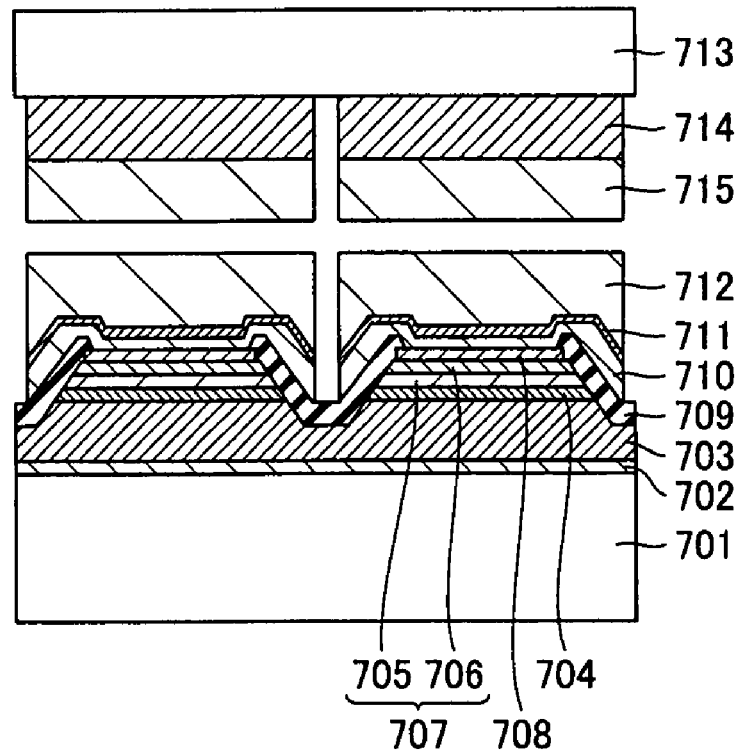
(b)
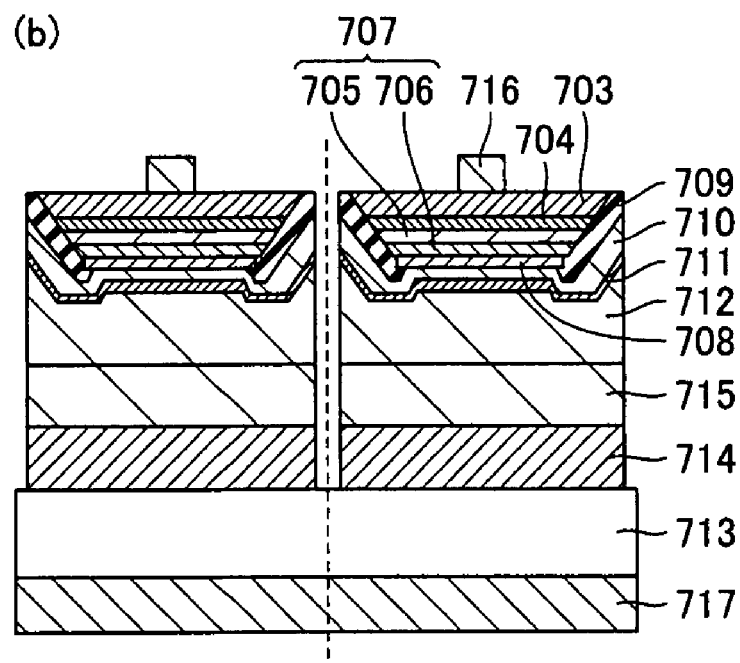

FIG.9
(a)
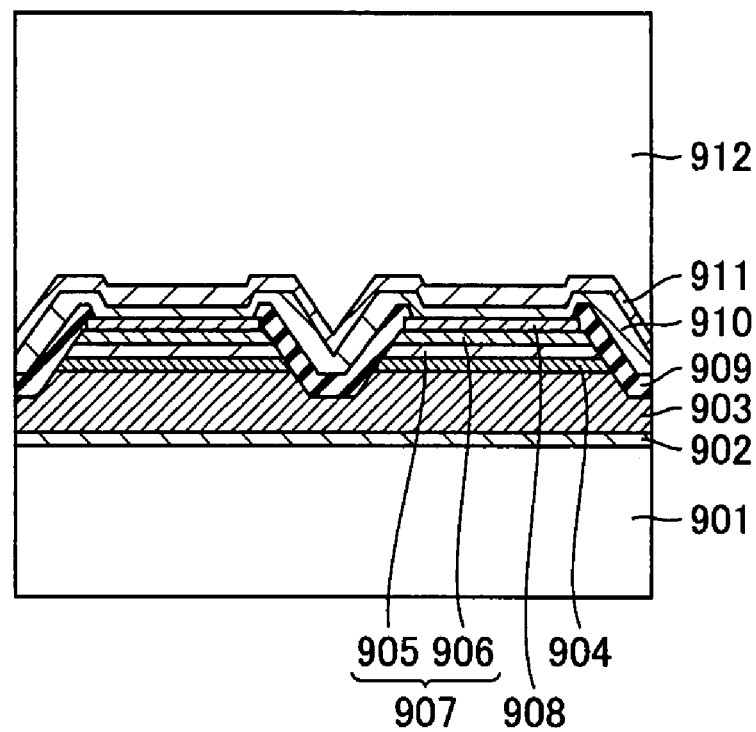
(b)
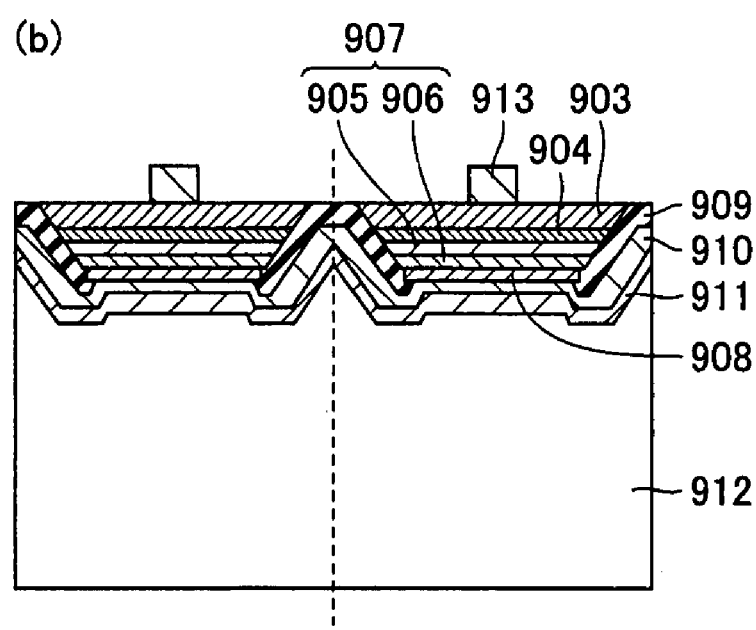

FIG.10
(a)
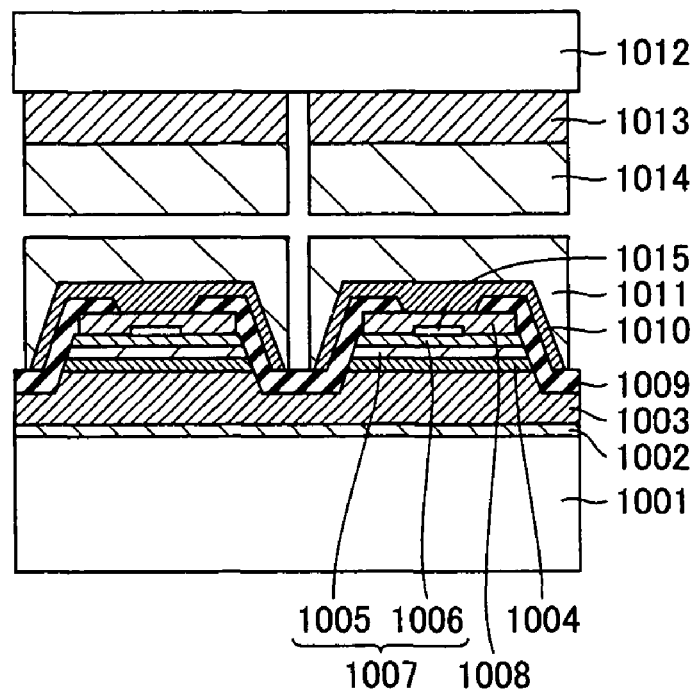
(b)
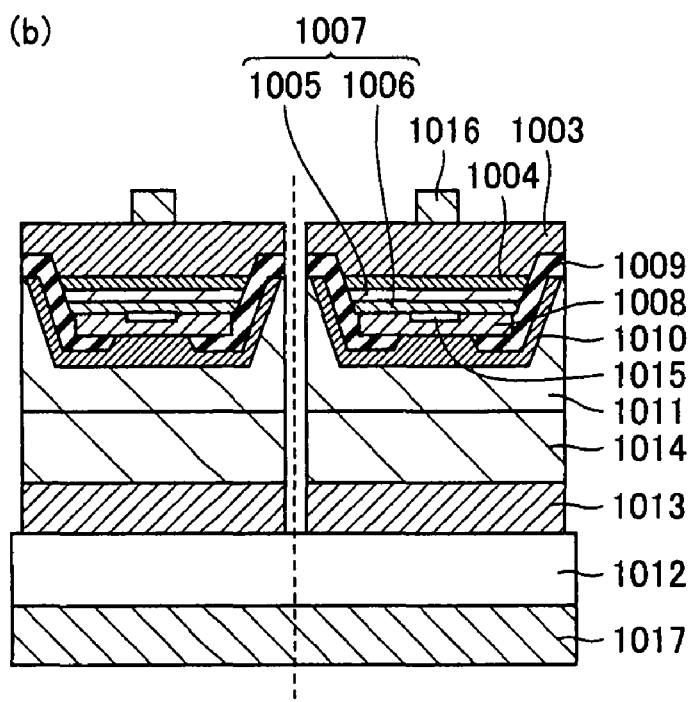

FIG.11
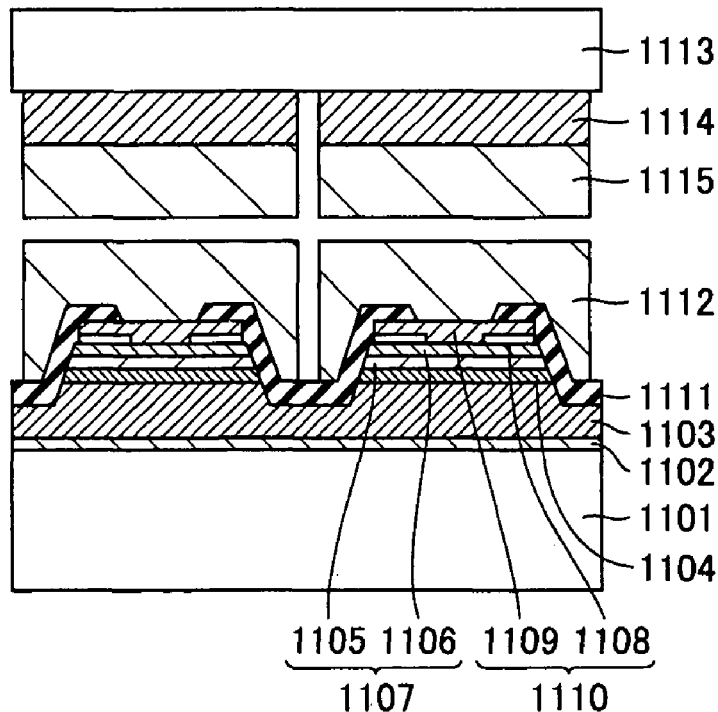
(a)
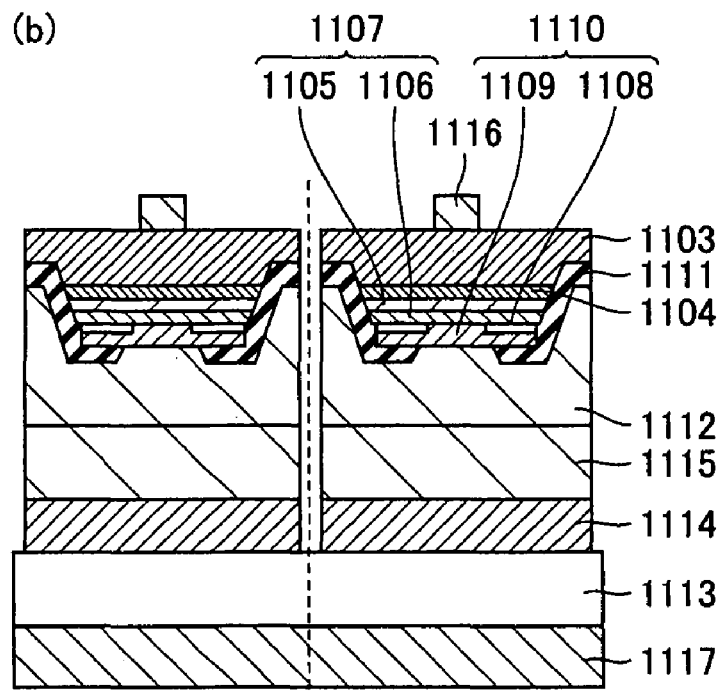
(b)

FIG.12
(a)
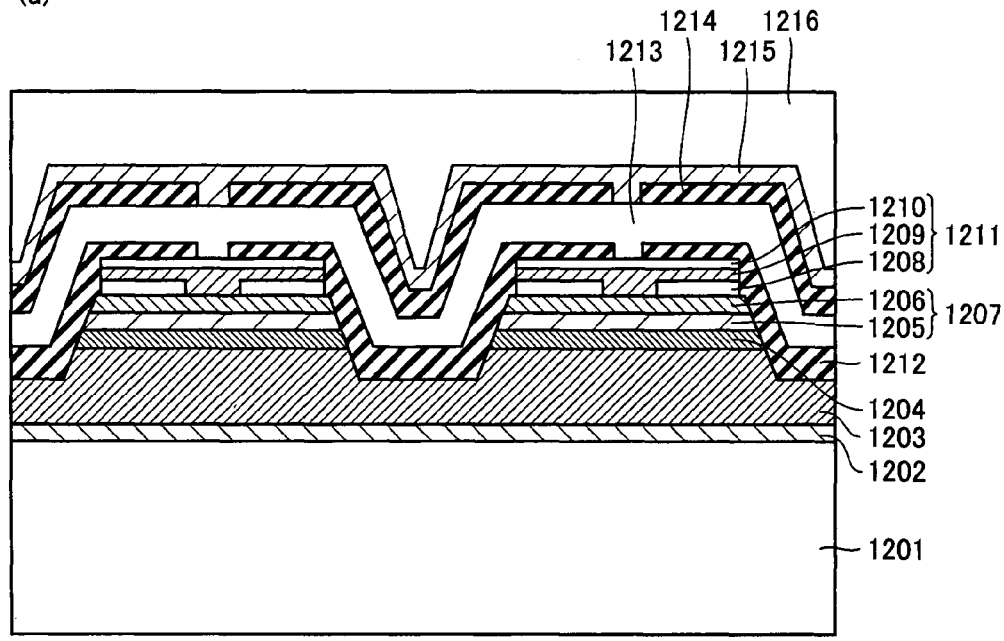
(b)
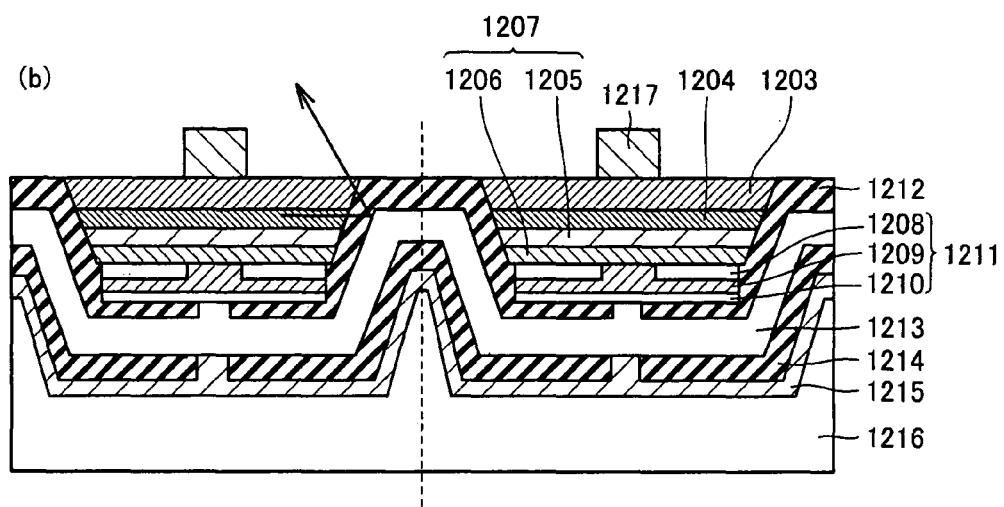

FIG.14
(a)
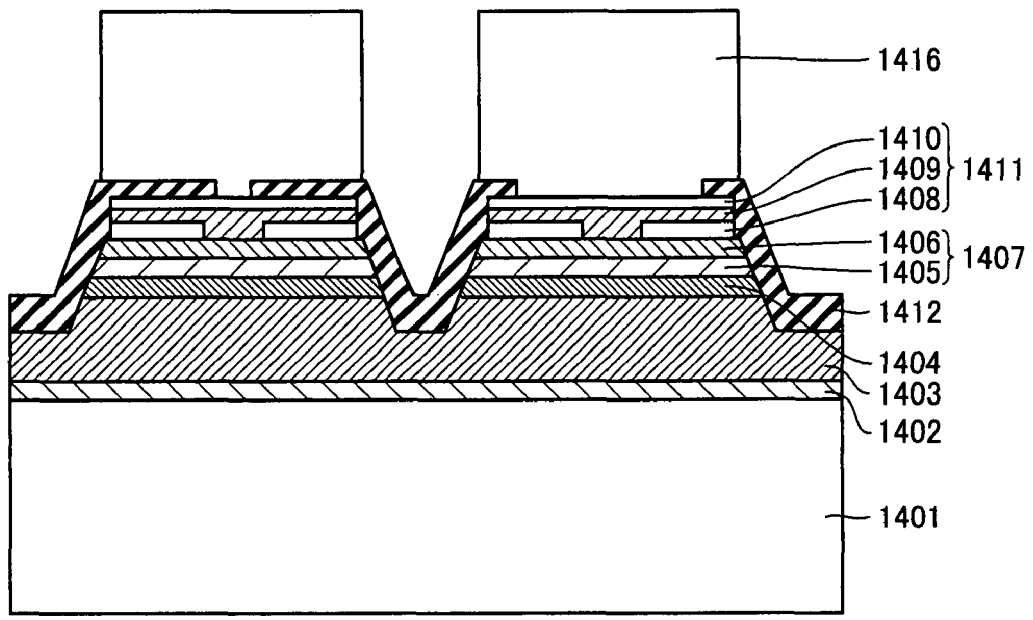
(b)
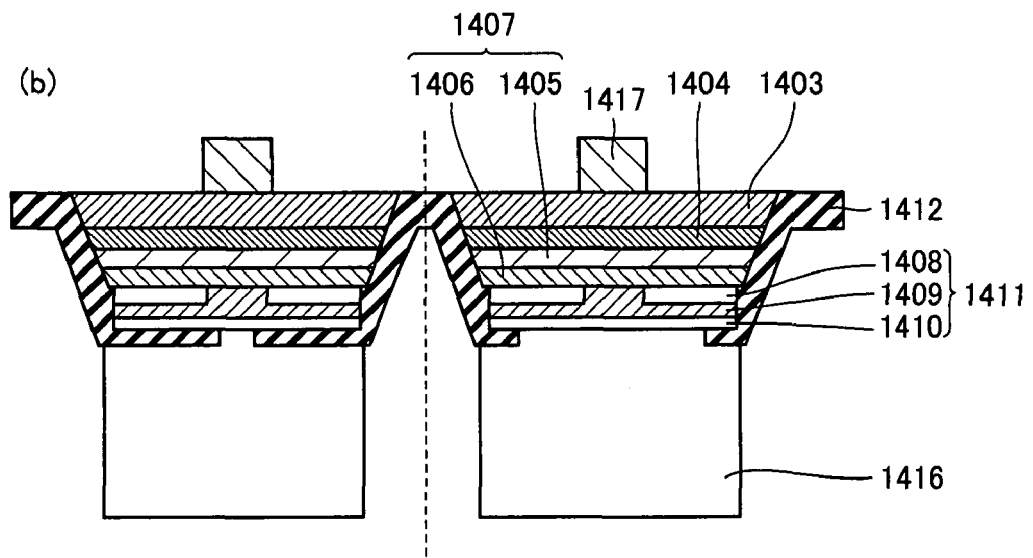

NITRIDE SEMICONDUCTOR LIGHT EMITTING DEVICE

This nonprovisional application is based on Japanese Patent Applications Nos. 2006-220153 and 2007-143705 filed with the Japan Patent Office on Aug. 11, 2006 and May 30, 2007, respectively, the entire contents of which are hereby incorporated by reference.

BACKGROUND OF THE INVENTION

1. Field of the Invention

The present invention relates to a semiconductor light emitting device using nitride semiconductor ($In_XAl_YGa_{1-X-Y}N$, $0 \leq X$, $0 \leq Y$, $X+Y \leq 1$) and a method of manufacturing the same.

2. Description of the Background Art

Nitride semiconductor receives attentions as a variety of semiconductor devices such as light emitting devices, and for example, blue LED (Light Emitting Diode), blue-green LED, and the like have been put to practical use.

Conventionally, nitride semiconductor light emitting devices are manufactured by growing nitride semiconductor in a stacked manner on an insulative substrate such as sapphire, spinel, lithium niobate, or neodymium gallate. However, when sapphire is used as a substrate material, (i) opposite electrodes have to be taken out from the same surface side of the sapphire substrate since sapphire is insulative, in other words, electrodes cannot be taken out from the top and the bottom of the substrate, (ii) accordingly, the chip size is increased so that a large number of chips cannot be obtained from a wafer, and (iii) because of high hardness and lack of cleavability of sapphire, sophisticated technique is required to form chips.

On the other hand, an attempt has been made to grow nitride semiconductor on a conductive substrate such as silicon carbide, silicon, zinc oxide, gallium arsenide, or gallium phosphide, which is, however, very difficult in the present situations.

In order to solve such problems, for example, Japanese Patent Laying-Open No. 2000-277804 discloses a method of manufacturing a nitride semiconductor light emitting device which ultimately has a conductive substrate, although a nitride semiconductor layer is grown in a stacked manner on an insulative substrate such as sapphire, and in which electrodes are taken out from the top and the bottom of the conductive substrate. With reference to FIG. 15, an exemplary method of manufacturing a nitride semiconductor light emitting device as disclosed in Japanese Patent Laying-Open No. 2000-277804 is schematically described.

First, a first ohmic electrode 1502 is formed on the almost entire surface of a nitride semiconductor layer 1501 stacked on a sapphire substrate. Here, nitride semiconductor layer 1501 at least includes, in order from the sapphire substrate, an n-type layer 1503 made of $Al_XGa_{1-X}N$ ($0 \leq X \leq 1$) doped with a donor impurity, an active layer 1504 made of $In_YGa_{1-Y}N$ ($0 \leq Y \leq 1$), and a p-type layer 1505 made of $Al_XGa_{1-X}N$ ($0 \leq X \leq 1$) doped with an acceptor impurity. Furthermore, a thin film, for example, of gold (Au), indium, tin, solder, or sliver paste is formed on the ohmic electrode 1502 in order to improve adhesiveness.

On the other hand, a second ohmic electrode 1507 is formed on the surface of a p-type GaAs substrate 1506 as a conductive substrate, and a thin film, for example, of gold (Au), indium, tin, solder, or silver paste is additionally formed thereon in order to improve adhesiveness. Next, the above-noted first ohmic electrode 1502 and the above-noted second ohmic electrode 1507 are affixed to each other and are compression bonded by heating. Next, the sapphire substrate is removed by polishing to expose n-type layer 1503 of nitride semiconductor layer 1501, and a negative electrode 1508 is thereafter formed on n-type layer 1503. On the other hand, a positive electrode 1509 is formed on the surface of p-type GaAs substrate 1506. A nitride semiconductor light emitting device (wafer) is thus obtained. Finally, the wafer having the positive electrode and the negative electrode is divided into a light emitting chip, for example, of 200 μm square, using cleavability of p-type GaAs substrate 1506, resulting in a nitride semiconductor light emitting chip having a structure as in FIG. 15.

Using such a manufacturing method, such a nitride semiconductor light emitting device can be realized that has a conductive substrate and has electrodes taken out from the top and the bottom of the conductive substrate.

SUMMARY OF THE INVENTION

However, in a nitride semiconductor light emitting device manufactured by the method described above and obtained by chip division, a PN junction portion is exposed at the tip end thereof. In this case, a metal layer, for example, of gold (Au), indium, tin, solder, silver paste or the like, which is formed on the ohmic electrode to improve adhesiveness, extends off the chip end portion and extends behind, because of non-cleavability and high viscosity of these metals, to cause a short circuit at the PN junction portion, resulting in poor yields. In addition, in the case where silver paste or the like is used as a metal layer, even when the initial property is normal, the leak current gradually increases after aging and the reliability is very poor as a light emitting device. This increase of leak current may be attributable to leakage of metal from the metal layer.

The present invention is made to solve the aforementioned problems. An object of the present invention is to provide a reliable, nitride semiconductor light emitting device in which short-circuit at the PN junction portion and current leakage are reduced as compared with the conventional, and a method of manufacturing the same.

In accordance with an aspect of the present invention, a nitride semiconductor light emitting device is provided which includes a conductive substrate, a first metal layer, a second conductivity-type semiconductor layer, an emission layer, and a first conductivity-type semiconductor layer, in this order, and additionally has an insulating layer which covers at least side surfaces of the second conductivity-type semiconductor layer, the emission layer and the first conductivity-type semiconductor layer.

Preferably, the insulating layer further covers part of that surface of the second conductivity-type semiconductor layer which is in contact with the first metal layer.

Preferably, when the insulating layer further covers part of that surface of the second conductivity-type semiconductor layer which is in contact with the first metal layer, an area where that surface of the second conductivity-type semiconductor layer which is in contact with the first metal layer is covered with the insulating layer is 1-50% of the entire surface of the second conductivity-type semiconductor layer which is in contact with the first metal layer.

In accordance with another aspect of the present invention, a nitride semiconductor light emitting device is provided which includes a conductive substrate, a first metal layer, a second metal layer, a second conductivity-type semiconductor layer, an emission layer, and a first conductivity-type semiconductor layer in this order, and additionally has an insulating layer which covers at least side surfaces of the second metal layer, the second conductivity-type semiconductor layer, the emission layer and the first conductivity-type semiconductor layer.

Preferably, the insulating layer further covers part of that surface of the second metal layer which is in contact with the first metal layer.

Preferably, when the insulating layer further covers part of that surface of the second metal layer which is in contact with the first metal layer, an area where that surface of the second metal layer which is in contact with the first metal layer is covered with the insulating layer is 1-99% of the entire surface of the second metal layer which is in contact with the first metal layer.

Preferably, in the nitride semiconductor light emitting device in the present invention, the second conductivity-type semiconductor layer, the emission layer and the first conductivity-type semiconductor layer are an inversely tapered structure in the vicinity of an end portion of the device.

Preferably, that surface of the first conductivity-type semiconductor layer which is opposite to a side in contact with the emission layer has projections and depressions.

Preferably, the nitride semiconductor light emitting device in the present invention has a first electrode formed on the first conductivity-type semiconductor layer and a second electrode formed on that surface of the conductive substrate which is opposite to a side in contact with the first metal layer.

The first metal layer may include a first ohmic layer in ohmic contact with the conductive substrate and/or a second ohmic layer in ohmic contact with the second conductivity-type semiconductor layer, and may include any one or more kinds of a eutectic bonding layer, a diffusion barrier layer, a reflection layer, and a plating underlying layer.

The second metal layer may include an ohmic layer in ohmic contact with the second conductivity-type semiconductor layer, and may include one or more kinds of a reflection layer, a diffusion barrier layer, a eutectic bonding layer, and a plating underlying layer. Preferably, a length of the second metal layer on a side in contact with the second conductivity-type semiconductor layer is equal to or shorter than a length of the second conductivity-type semiconductor layer on a side in contact with the second metal layer.

Preferably, the nitride semiconductor light emitting device in the present invention has a current blocking layer formed on part of that surface of the second conductivity-type semiconductor layer which is opposite to a side in contact with the emission layer.

Preferably, the current blocking layer is formed on that surface of the second conductivity-type semiconductor layer which is opposite to a side in contact with the emission layer and at a position approximately immediately below a position where the first electrode is installed.

Furthermore, the present invention provides a method of manufacturing a nitride semiconductor light emitting device including the steps of: (A) stacking a first conductivity-type semiconductor layer, an emission layer, and a second conductivity-type semiconductor layer in this order on a first substrate; (B) forming a plurality of depression portions at approximately regular intervals on an exposed surface of the stacked layers, each having a depth at least reaching that surface of the first conductivity-type semiconductor layer which faces the emission layer; (C) forming an insulating layer on the entire exposed surface of the stacked layers, including a side wall and a bottom surface of the depression portion; (D) exposing part of a surface of a layer in contact with the insulating layer by removing part of the insulating layer; (E) stacking a first metal layer and a second substrate in this order on the entire exposed surface; and (F) obtaining a plurality of nitride semiconductor light emitting devices by performing chip division.

The method of manufacturing a nitride semiconductor light emitting device in the present invention may further include the step (G) of stacking a second metal layer, between the step (A) and the step (B) or between the step (B) and the step (C).

The method of manufacturing a nitride semiconductor light emitting device in the present invention may include the step (H) of removing whole or part of the first substrate, after the step (E), and in this case, may include the step (I) of removing part of the first conductivity-type semiconductor layer to expose a bottom surface of the depression portion, after the step (H).

Preferably, in the step (I), part of the first conductivity-type semiconductor layer is removed and projections and depressions are formed on a surface of the first conductivity-type semiconductor layer.

Removal of the first substrate in the step (H) and removal of the first conductivity-type semiconductor layer in the step (I) may be performed by laser light radiation. Furthermore, removal of the first substrate in the step (H) and removal of the first conductivity-type semiconductor layer and formation of projections and depressions on a surface of the first conductivity-type semiconductor layer in the step (I) may be performed by laser light radiation.

Preferably, in the step (F), a position subjected to chip division is any position on a bottom surface of the depression portion.

Preferably, formation of the depression portion in the step (B) is performed by etching.

Stacking of the second substrate in the step (E) may be performed by bonding a first eutectic bonding layer included in the first metal layer and a second eutectic bonding layer formed on the second substrate to each other. In this case, bonding of the first eutectic bonding layer and the second eutectic bonding layer is preferably performed at 280-400° C., in particular when these eutectic bonding layers are formed of Au and AuSn. Bonding of the first eutectic bonding layer and the second eutectic bonding layer is preferably performed under a reduced pressure of 10 Pa or lower.

Stacking of the second substrate in the step (E) may be performed by a plating method. In this case, the second substrate is formed of a metal or an alloy having a thickness of 50 μm or more.

In the step (D), the second metal layer can function as an etching stop layer.

In the step (E), the first metal layer may be formed in a discontinuous manner at approximately regular intervals.

According to the present invention, the PN junction portion is coated with an insulating layer so that a source of leak current such as metal intrusion can be reduced, for example, in the step of forming the nitride semiconductor light emitting device wafer into chips, thereby enhancing the yield. In addition, it is possible to provide a reliable, nitride semiconductor light emitting device with less degradation even when the device is powered for a long time or fed with large current.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a schematic process view showing another preferable example of the method of the present invention.

FIGS. 6 and 7 are schematic process views showing a further preferable example of the method of the present invention.

FIG. 9 is a schematic process view showing yet another preferable example of the method of the present invention.

FIGS. 10-12 are schematic process views illustrating the methods of Examples 5, 7 and 8, respectively.

FIG. 14 is a schematic process view illustrating the method in Example 9.

DESCRIPTION OF THE PREFERRED EMBODIMENTS

In the following, the present invention will be described in detail by illustrating the embodiments.

First Embodiment

Figure 1:
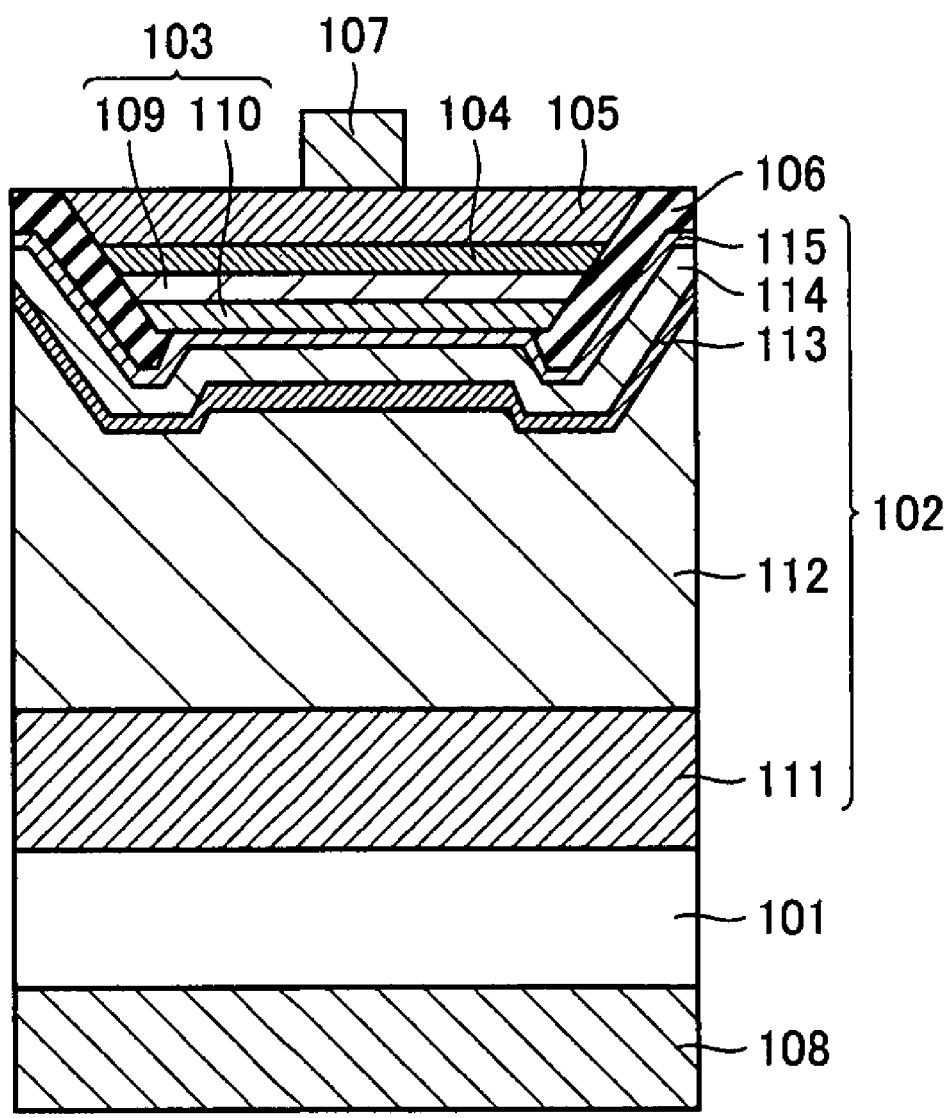
FIG. 1 is a schematic cross-sectional view of a nitride semiconductor light emitting device in a preferable embodiment of the present invention.

FIG. 1 is a schematic cross-sectional view showing a nitride semiconductor light emitting device in a preferable embodiment of the present invention. As shown in FIG. 1, the nitride semiconductor light emitting device in the present embodiment includes a conductive substrate 101, a first metal layer 102, a second conductivity-type semiconductor layer 103, an emission layer 104, and a first conductivity-type semiconductor layer 105, in this order. In addition, the nitride semiconductor light emitting device has an insulating layer 106 which covers the side surfaces of second conductivity-type semiconductor layer 103, emission layer 104 and first conductivity-type semiconductor layer 105 as well as part of that surface of second conductivity-type semiconductor layer 103 which is in contact with first metal layer 102. The nitride semiconductor light emitting device in the present embodiment additionally has a first electrode 107 for external connection formed on first conductivity-type semiconductor layer 105 and a second electrode 108 for external connection formed on that surface of conductive substrate 101 which is opposite to the surface on which first metal layer 102 is formed.

Here, in the nitride semiconductor light emitting device in the present embodiment, second conductivity-type semiconductor layer 103 is formed of a p-type AlGaN layer 109 and a p-type GaN layer 110. First metal layer 102 includes a first ohmic layer 111, a eutectic bonding layer 112, a diffusion barrier layer 113, a reflection layer 114, and a second ohmic layer 115, in this order. P-type GaN layer 110 of second conductivity-type semiconductor layer 103 is in contact with second ohmic layer 115 of first metal layer 102.

In this manner, since the PN junction portion is protected by covering the side surfaces of second conductivity-type semiconductor layer 103, emission layer 104 and first conductivity-type semiconductor layer 105 with insulating layer 106, the end surface leak does not occur and the yield is improved. In addition, a reliable nitride semiconductor light emitting device is provided in which metal intrusion is not observed at the PN junction portion in long-term power supply.

<Conductive Substrate>

In the nitride semiconductor light emitting device in the present embodiment, a material used for conductive substrate 101 is a material that does not allow layer formation by plating. Examples of such materials are Si, GaP, GaAs, SiC and conductive diamond.

<First Metal Layer>

First metal layer 102 in the present embodiment includes first ohmic layer 111, eutectic bonding layer 112, diffusion barrier layer 113, reflection layer 114 and second ohmic layer 115, in this order, as described above. In the following, each layer will be described.

Here, "first metal layer" is different from "second metal layer" as described later in formation position in the nitride semiconductor light emitting device. In this specification, "first metal layer" is referred to a layer which is different from the first conductivity-type semiconductor layer, the emission layer and the second conductivity-type semiconductor layer and which is a metal layer positioned on the opposite side to the second conductivity-type semiconductor layer as viewed from the insulating layer. By contrast, "second metal layer" is referred to a layer which is different from the first conductivity-type semiconductor layer, the emission layer and the second conductivity-type semiconductor layer and which is a metal layer positioned on the second conductivity-type semiconductor layer side as viewed from the insulating layer.

(i) First Ohmic Layer

In the present embodiment, first metal layer 102 includes first ohmic layer 111 formed of a single-layer structure or a multi-layer structure of a metal, an alloy, or a conductive oxide in ohmic contact with conductive substrate 101. Provision of first ohmic layer 111 can reduce the driving voltage of the semiconductor light emitting device.

Here, a conventionally known metal, alloy or conductive oxide can be employed to form first ohmic layer 111. Examples are Ti, Au, Al and an alloy including them, as well as ITO (Indium Tin Oxide), and so on. First ohmic layer 111 may be a single-layer structure or a multi-layer structure. An example of a multi-layer structure is a two-layer structure of a Ti layer and an Au layer. The thickness of first ohmic layer 111 is not particularly limited and a thickness usually used in the art may be employed. The thickness of first ohmic layer 111 may be, for example, about 1-5000 nm.

(ii) Eutectic Bonding Layer

In the present embodiment, first metal layer 102 includes eutectic bonding layer 112 formed of a single-layer structure or a multi-layer structure of a metal or an alloy, including a eutectic bonding metal. Because of provision of eutectic bonding layer 112, the adhesion strength between conductive substrate 101 and the nitride semiconductor layer is kept by eutectic bonding, so that it becomes possible to provide a reliable nitride semiconductor light emitting device.

Here, a conventionally known metal or alloy including a eutectic bonding metal may be employed. Examples are Au, AuSn, AuGe, AuSi, and an alloy of Ag, Pd and Cu. Eutectic bonding layer 112 may be a single-layer structure or a multi-layer structure. An example of a multi-layer structure is a two-layer structure of an Au layer and an AuSn layer. The thickness of eutectic bonding layer 112 is not particularly limited, and a thickness usually used in the art may be employed. The thickness of eutectic bonding layer 112 may be, for example, about 50-3000 nm.

(iii) Diffusion Barrier Layer

In the present embodiment, first metal layer 102 includes diffusion barrier layer 113 formed of a single-layer structure or a multi-layer structure of a metal or an alloy for preventing diffusion of a metal. Provision of diffusion barrier layer 113 prevents reduced bonding strength due to mutual diffusion of metals and reduced device characteristics due to diffusion of metal into semiconductor, so that it becomes possible to provide a reliable nitride semiconductor light emitting device.

Here, a conventionally known metal or alloy may be employed to form diffusion barrier layer 113. Examples are Ti, Ni, W, Mo, Nb, Ta, and NiTi. Two or more kinds of these metals and alloys may be combined. Diffusion barrier layer 113 may be a single-layer structure or a multi-layer structure. The thickness of diffusion barrier layer 113 is not particularly limited, and a thickness usually used in the art may be employed. The thickness of diffusion barrier layer 113 may be, for example, about 50-500 nm.

(iv) Reflection Layer

In the present embodiment, first metal layer 102 includes reflection layer 114 formed of a single-layer structure or a multi-layer structure of a metal or an alloy having high reflectivity for the main emission wavelength of the semiconductor light emitting device. Light emitted from emission layer 104 directly passes through first conductivity-type semiconductor layer 105 to be taken out to the outside of the semiconductor device and, in addition, is once emitted to the first metal layer 102 side, reflected by first metal layer 102 and thereafter taken out to the outside of the semiconductor device. Provision of reflection layer 114 in first metal layer 102 improves the light extraction efficiency, so that it becomes possible to provide a nitride semiconductor light emitting device with high emission efficiency. Here, "having high reflectivity" means having reflectivity of about 70-100% for the main emission wavelength of the semiconductor light emitting device.

Examples of metals or alloys having high reflectivity for the main emission wavelength of the semiconductor light emitting device are Ag, AgNd, AgPd, AgCu, Al, and AgBi. Among these, AgNd, Ag and AgBi can preferably be used as reflection layer 114 since the reflectivity is as high as about 90%, for example, in the case where the main emission wavelength is 450 nm. The thickness of reflection layer 114 is not particularly limited, and a thickness usually used in the art may be employed. The thickness of reflection layer 114 is, for example, about 50-1000 nm.

(v) Second Ohmic Layer

In the present embodiment, first metal layer 102 includes second ohmic layer 115 formed of a single-layer structure or a multi-layer structure of a metal, an alloy or a conductive oxide which is in ohmic contact with second conductivity-type semiconductor layer 103. Provision of second ohmic layer 115 can further reduce the driving voltage of the semiconductor light emitting device.

A conventionally known metal, alloy or conductive oxide may be employed to form second ohmic layer 115. Examples are Pd, Ni, Mo, Au, Fe, Cu, Zn, Al, Mg, Ti, W, Ta, Ag, and the like. Two or more kinds of these metals may be combined. Second ohmic layer 115 may be a single-layer structure or a multi-layer structure. The thickness of second ohmic layer 115 is not particularly limited, and a thickness usually used in the art may be employed. The thickness of second ohmic layer 115 may be, for example, about 0.5-10 nm in a case of a material having low reflectivity. The thickness of second ohmic layer 115 may usually be about 10-5000 nm, thought not limited thereto, in a case of a material having high reflectivity.

<Second Conductivity-Type Semiconductor Layer>

In the present embodiment, second conductivity-type semiconductor layer 103 is formed of two layers, namely p-type AlGaN layer 109 and p-type GaN layer 110. The respective thicknesses of p-type AlGaN layer 109 and p-type GaN layer 110 are not particularly limited and may be, for example, 10-100 nm and 50-1000 nm, respectively.

<Emission Layer>

In the present embodiment, emission layer 104 includes a barrier layer made of GaN and a well layer made of $In_qGa_{1-q}N$ ($0 \leq q \leq 1$). The respective thicknesses of the barrier layer and the well layer are not particularly limited and may be, for example, 3-30 nm and 0.5-5 nm, respectively.

<First Conductivity-Type Semiconductor Layer>

In the present embodiment, first conductivity-type semiconductor layer 105 is formed of an n-type GaN layer. The thickness of first conductivity-type semiconductor layer 105 is not particularly limited and may be, for example, 2-10 nm.

Here, in the nitride semiconductor light emitting device in the present embodiment, the main light exit surface is that surface of first conductivity-type semiconductor layer 105 which is opposite to the side on which emission layer 104 is formed, and this surface preferably has projections and depressions. The projections and depressions may have regularity or may be random. In the case of having regularity, the pitch may be about 100-5000 nm and the depth may be 0.5-10 μm. In this way, the light extraction efficiency is improved by forming projections and depressions on the main light exit surface, so that it becomes possible to obtain a light emitting device with high emission efficiency. The projections and depressions may be formed, for example, by etching, laser radiation, polishing, or the like. Here, the projections and depressions may be formed by forming depressed portions at the surface of first conductivity-type semiconductor layer 105 or may be formed by forming projecting portions by leaving part of the substrate such as a sapphire substrate when the substrate is removed. In the case of the latter, projections and depressions, for example, having about a few tens of μm depth may be formed.

<Insulating Layer>

Insulating layer 106 covers the side surfaces of the aforementioned second conductivity-type semiconductor layer 103, emission layer 104 and first conductivity-type semiconductor layer 105. Because of such a configuration, the PN junction portion is protected, so that the end surface leak does not occur and the yield is improved. In addition, in long-term power supply, metal intrusion at the PN junction is not observed, and a reliable nitride semiconductor light emitting device is provided.

Here, insulating layer 106 in this embodiment covers the side surfaces of second conductivity-type semiconductor layer 103, emission layer 104 and first conductivity-type semiconductor layer 105 and, in addition, covers part of that surface of the aforementioned second conductivity-type semiconductor layer 103 which is in contact with the aforementioned first metal layer 102. In other words, insulating layer 106 covers the side surfaces of second conductivity-type semiconductor layer 103, emission layer 104 and first conductivity-type semiconductor layer 105 and extends from the side surface to the lower surface (that surface which faces first metal layer 102) of second conductivity-type semiconductor layer 103 so that one end of insulating layer 106 is positioned on the lower surface of second conductivity-type semiconductor layer 103. This configuration ensures that the entire side surface, namely, the entire PN junction portion is covered with insulating layer 106.

In the case where insulating layer 106 covers part of that surface of second conductivity-type semiconductor layer 103 which is in contact with first metal layer 102, the area in which that surface of second conductivity-type semiconductor layer 103 which is in contact with first metal layer 102 is covered with insulating layer 106 is preferably 1-50% of the entire surface of second conductivity-type semiconductor layer 103 which is in contact with first metal layer 102. If the coated area is larger than 50%, current is not injected to the region where insulating layer 106 and second conductivity-type semiconductor layer 103 are in contact with each other, and therefore the area where current is injected becomes less than 50%, possibly reducing the emission efficiency. On the other hand, if the coated area is less than 1%, in a step of partially removing insulating layer 106 formed on the entire surface of second conductivity-type semiconductor layer 103 as described later, poor alignment occurs and the yield tends to be reduced to some extent. However, the coated area of less than 1%, for example, ultimately 0%, does not depart from the scope of the present invention, and the effect as described above are fully achieved as long as insulating layer 106 covers at least the side surfaces of second conductivity-type semiconductor layer 103, emission layer 104 and first conductivity-type semiconductor layer 105.

Any material may be employed to form insulating layer 106 as long as it is insulative. Examples may be $SiO_2$, SiN, $Si_3N_4$, $HfO_2$, $TiO_2$, $Al_2O_3$, HfLaO, HfAlO, LaAlO, and so on. Among these, $SiO_2$ is preferably used because of good controllability of film formation. The thickness of insulating film 106 is not particularly limited and may be, for example, 30-3000 nm.

<First Electrode and Second Electrode>

The nitride semiconductor light emitting device in the present embodiment has first electrode 107 for external connection formed on first conductivity-type semiconductor layer 105 and second electrode 108 for external connection formed on that surface of conductive substrate 101 which is opposite to the surface on which first metal layer 102 is formed. In other words, first electrode 107 is formed on that surface of first conductivity-type semiconductor layer 105 which is opposite to the surface on which emission layer 104 is formed, and second electrode 108 is formed on that surface of conductive substrate 101 which is opposite to the surface on which first metal layer 102 is formed. In this manner, in the nitride semiconductor light emitting device in the present embodiment, although insulating layer 106 is provided in the device, electrodes can be taken out from the top and the bottom of the chip. Since the electrodes for external connection are formed on the top and bottom surfaces of a chip, the chip can be handled easily when being mounted, thereby improving mounting yield.

Conventionally known materials may be employed as appropriate as materials used for first electrode 107 and second electrode 108. First electrode 107 and second electrode 108 may have a conventionally known structure. For example, first electrode 107 may be a two-layer structure using, for example, Ti, Al and the like. Second electrode 108 may be a two-layer structure using, for example, Ti, Al and the like, similarly.

Here, as shown in FIG. 1, second conductivity-type semiconductor layer 103, emission layer 104 and first conductivity-type semiconductor layer 105 are an inversely tapered structure in the vicinity of the device end portion. In other words, the area of the surface of each layer is gradually reduced from first conductivity-type semiconductor layer 105 to second conductivity-type semiconductor layer 103. Such a structure improves the light extraction efficiency at the device end portion so that it is possible to obtain a light emitting device with high emission efficiency.

The nitride semiconductor light emitting device in the first embodiment as described above is susceptible to a variety of modifications without departing from the scope of the present invention. For example, the structure and composition of first conductivity-type semiconductor layer 105, emission layer 104 and second conductivity-type semiconductor layer 103 is not limited to the one as described above and may be, for example, AlInGaN. First metal layer 102 may not include all of the aforementioned first ohmic layer 111, eutectic bonding layer 112, diffusion barrier layer 113, reflection layer 114, and second ohmic layer 115. One or two or more of them may be eliminated. For example, reflection layer 114 may also serve as a second ohmic layer. Two or more of each of reflection layer 114 and diffusion barrier layer 113 are alternately formed.

Furthermore, a current blocking layer may be provided on part of that surface of second conductivity-type semiconductor layer 103 which is opposite to the side in contact with emission layer 104. Provision of a current blocking layer allows current to be injected to an emission region efficiently, so that it is possible to obtain a light emitting device with high emission efficiency. The current blocking layer is preferably formed on that surface of second conductivity-type semiconductor layer 103 which is opposite to the surface on which emission layer 104 is formed and at a position approximately immediately below the position where first electrode 107 is installed. Formation of a current blocking layer at such a position allows current to be injected to an emission region more efficiently. More specifically, for example, when an opaque thick metal layer or the like is used for first electrode 107, light cannot be taken out from that portion and light is therefore wasted. However, by providing a current blocking layer in the vicinity immediately below first electrode 107, emission does not occur in the region in the vicinity immediately below the installation position of first electrode 107, thereby preventing loss, and it is possible to obtain a light emitting device with high emission efficiency. A conventionally known material, for example, Ti, $SiO_2$ or the like, may be used for the current blocking layer.

Figure 2:
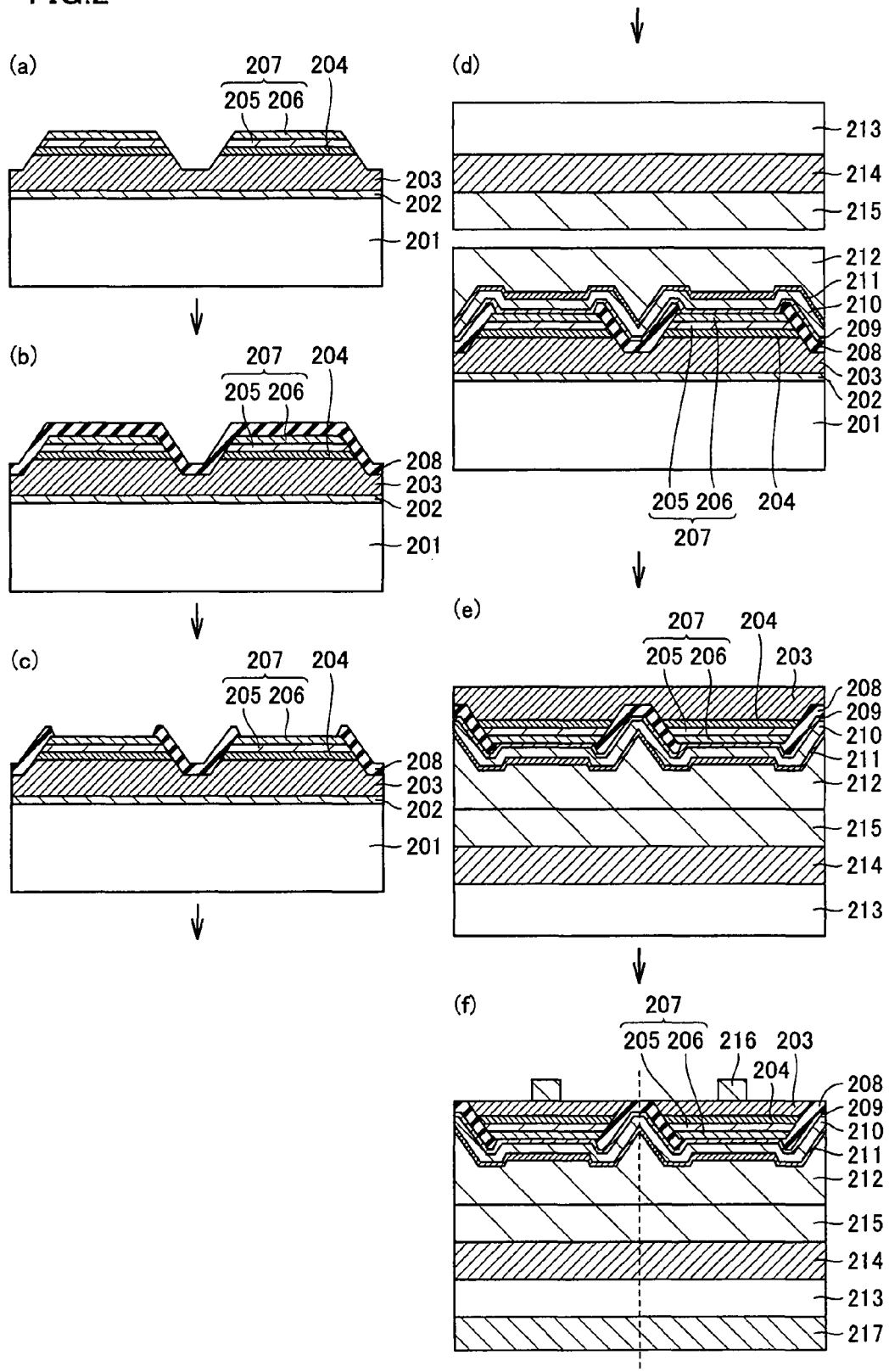
FIG. 2 is a schematic process view showing a preferable example of the method of the present invention.

Next, referring to FIG. 2, a preferable method of manufacturing the nitride semiconductor light emitting device in the first embodiment as described above will be described. FIG. 2 is a schematic process view showing a preferable example of the method in accordance with the present invention. In FIG. 2, a semiconductor light emitting device in several steps is schematically shown in cross section. The method of manufacturing the nitride semiconductor light emitting device in the present embodiment includes the following steps in the following order:

(1) step (A) of stacking a first conductivity-type semiconductor layer, an emission layer, and a second conductivity-type semiconductor layer, in this order, on a first substrate;

(2) step (B) of forming a plurality of depression portions at approximately regular intervals on an exposed surface of the stacked layers, each having a depth at least reaching that surface of the first conductivity-type semiconductor layer which faces the emission layer;

(3) step (C) of forming an insulating layer on the entire exposed surface of the stacked layers, including the side wall and the bottom surface of the depression portion;

(4) step (D) of exposing part of the surface of the layer in contact with the insulating layer by removing part of the insulating layer;

(5) step (E) of stacking a first metal layer and a second substrate in this order on the entire exposed surface;

(6) step (H) of removing the whole or part of the first substrate;

(7) step (I) of removing part of the first conductivity-type semiconductor layer so as to expose the bottom surface of the depression portion; and (8) step (F) of obtaining a plurality of nitride semiconductor light emitting devices by performing chip division.

In manufacturing the nitride semiconductor light emitting device in the first embodiment as described above, first, for example, a sapphire substrate is prepared as a first substrate 201. Then, a buffer layer 202 made of $Al_rGa_{1-r}N$ ($0 \leq r \leq 1$), an n-type GaN layer as a first conductivity-type semiconductor layer 203, an emission layer 204 including a barrier layer made of GaN and a well layer made of $In_qGa_{1-q}N$ ($0 \leq q \leq 1$), and a second conductivity-type semiconductor layer 207 formed of a p-type AlGaN layer 205 and a p-type GaN layer 206 are grown in this order on first substrate 201 by means usually used in the art (step (A)).

Next, an approximately square photoresist mask is formed at a regular pitch, and thereafter, for the portion that is not covered with the photoresist, second conductivity-type semiconductor layer 207, emission layer 204 and first conductivity-type semiconductor layer 203 are removed by dry etching, as shown in FIG. 2($a$), whereby a plurality of depression portions are formed at approximately regular intervals corresponding to the regular pitches of the photoresist mask (step (B)). The depth of the depression portion is preferably set to such an extent that it passes through emission layer 204 and reaches first conductivity-type semiconductor layer 203 but does not pass through first conductivity-type semiconductor layer 203. Here, by using a photoresist as a mask, the depression portion is formed like an approximately inversed trapezoid, so that the nitride semiconductor layer portion after etching, namely, the second conductivity-type semiconductor layer 207, emission layer 204 and first conductivity-type semiconductor layer 203 portion becomes a tapered structure.

The depth of the depression portion is preferably set to such an extent that first substrate 201 is not exposed. If first substrate 201 is exposed in the depression portion, insulating layer 208 is in contact with first substrate 201 in the depression portion when insulating layer 208 is formed in step (C) as described later. In step (H) described later, first substrate 201 is removed by decomposing buffer layer 202 and first conductivity-type semiconductor layer 203 by applying laser light from the back surface of first substrate 201. If insulating layer 208 and first substrate 201 are in contact with each other in the depression portion, laser light is transmitted through first substrate 201 and insulating layer 208 at that part and does not result in decomposition. Therefore, insulating layer 208 and first substrate 201 are not separated from each other. More specifically, when first substrate 201 is intended to be detached, insulating layer 208 in the depression portion is pulled by first substrate 201 and insulating layer 208 is torn whereby the insulating layer covering the PN junction peels off. As a result, leak may occur.

Even if peeling of the insulating layer at the PN junction can be avoided, in the step of removing first conductivity-type semiconductor layer 203 so as to expose the bottom surface of the depression portion (step (I) as described later), breakage of the insulating layer in the depression portion results in whisker and the like from the exposed first metal layer to cause leak between the end portion of first conductivity-type semiconductor layer 203 and the first metal layer. Therefore, in order to prevent this, in the step of forming the depression portion, first substrate 201 is preferably not exposed. Buffer layer 202 has a thickness of a few nm depending on conditions and is not always a uniform film and not always cover the entire surface of first substrate 201. Therefore, the depth of the depression portion is preferably set to such an extent that it does not pass through first conductivity-type semiconductor layer 203.

Next, after removal of the photoresist, as shown in FIG. 2($b$), $SiO_2$ layer is formed as insulating layer 208 to continuously cover the entire surface, namely, the surface of second conductivity-type semiconductor layer 207, the side surfaces of second conductivity-type semiconductor layer 207, emission layer 204 and first conductivity-type semiconductor layer 203 exposed in step (B) corresponding to the side wall of the depression portion, and the surface of first conductivity-type semiconductor layer 203 exposed in step (B) corresponding to the bottom surface of the depression portion (step (C)). Then, as shown in FIG. 2($c$), part of insulating layer 208 formed on the surface of second conductivity-type semiconductor layer 207 is removed by etching to expose part of the surface of second conductivity-type semiconductor layer 207 which is a layer in contact with insulating layer 208 (step (D)). Here, a photoresist mask is used in etching. The etching may be wet etching or dry etching. Here, as described above, etching is preferably performed so that the area of the surface of second conductivity-type semiconductor layer 207 that is covered with insulating layer 208 is 1-50% of the entire surface of second conductivity-type semiconductor layer 207 which is opposite to the surface on which emission layer 204 is formed.

Then, step (E) follows in which a first metal layer and a second substrate are stacked in this order on the entire exposed surface, that is, on insulating layer 208 and on the exposed second conductivity-type semiconductor layer 207. In this step, first, as shown in FIG. 2($d$), a second ohmic layer 209, a reflection layer 210, a diffusion barrier layer 211, and a first eutectic bonding layer 212 are formed in this order on insulating layer 208 and on the exposed second conductivity-type semiconductor layer 207. Second ohmic layer 209 is formed of, for example, Pd, Ni, Mo, Au, Fe, Cu, Zn, Al, Mg, Ti, W, Ta, Ag, and the like and is formed, for example, by evaporation. Reflection layer 210 is formed of, for example, AgNd, Ag, AgPd, AgCu, Al, and the like and is formed, for example, by sputtering. Diffusion barrier layer 211 is formed of, for example, NiTi, Ti, Ni, W, Mo, Nb, Ta, and the like and is formed, for example, by sputtering. First eutectic bonding layer 212 is formed of, for example, Au and the like, and is formed, for example, by evaporation.

Next, as shown in FIG. 2($d$), after a first ohmic layer 214 is formed on a second substrate 213, for example, an Si substrate by means usually used in the art, a second eutectic bonding layer 215 is formed thereon. First ohmic layer 214 may be a two-layer structure of, for example, a Ti layer and an Au layer. Second eutectic bonding layer 215 is formed, for example, of AuSn and is formed by evaporation. The formation of first ohmic layer 214 and second eutectic bonding layer 215 on second substrate 213 may be carried out at any timing before the formation of first eutectic bonding layer 212 is completed or may be carried out simultaneously with or after the completion of formation of first eutectic bonding layer 212.

Next, first eutectic bonding layer 212 and second eutectic bonding layer 215 are brought into contact and bonded to each other by thermocompression bonding under a reduced pressure atmosphere. The reduced pressure is preferably 10

Pa or lower. The reduced pressure atmosphere can prevent voids. Furthermore, the temperature in bonding is preferably 280-400° C., particularly preferably 300-350° C., especially in the case of bonding between an Au layer and an AuSn layer. With 300-350° C., the adhesiveness can further be improved. The bonding pressure may be, for example, about 10-about 300 N/cm², though not particularly limited thereto.

Next, first substrate 201 is removed by decomposing the whole or a large part of buffer layer 202 and part of first conductivity-type semiconductor layer 203 by applying laser light of, for example, 355 nm or 266 nm, from the back surface of first substrate 201 (step (H)). Thus, a wafer having the structure shown in FIG. 2(e) is obtained. Although first substrate 201 and the whole or a large part of buffer layer 202 are removed by laser light radiation, part of first substrate 201 may be left. The light extraction efficiency can be improved by leaving part of first substrate 201 and forming a projecting portion.

Next, part of first conductivity-type semiconductor layer 203 exposed by removing first substrate 201 and buffer layer 202 is removed by dry etching (step (I)). The removal of first conductivity-type semiconductor layer 203 is performed so that the bottom surface of the depression portion formed in step (B) is exposed. Here, in removal of first conductivity-type semiconductor layer 203, the approximately uniform thickness of first conductivity-type semiconductor layer 203 as a whole may be removed so as to expose the bottom surface of the depression portion or first conductivity-type semiconductor layer 203 only on the bottom surface of the depression portion may be removed so as to expose the bottom surface of the depression portion. Here, the dry etching allows first conductivity-type semiconductor layer 203 to be removed and also allows projections and depressions to be formed on the surface of first conductivity-type semiconductor layer 203. As described above, formation of projections and depressions results in improvement in light extraction efficiency. In this step, part of first conductivity-type semiconductor layer 203 is removed to expose the bottom surface of the depression portion formed in step (B), and in addition, a chip division groove for chip division in the next step is formed at the bottom surface of the depression portion. As a result of this step, the semiconductor layer part including first conductivity-type semiconductor layer 203, emission layer 204 and second conductivity-type semiconductor layer 207 is discontinuous at regular pitches.

Here, in the aforementioned step (B), if a depression portion is formed to be deep and the thickness of first conductivity-type semiconductor layer 203 at the portion in contact with the bottom surface of the depression portion is thin enough, in place of removal of first conductivity-type semiconductor layer 203 and/or formation of projections and depressions on the surface of first conductivity-type semiconductor layer 203 by dry etching in the aforementioned step (I), first substrate 201 may be removed by laser light in step (H) followed by step (I) for removal of first conductivity-type semiconductor layer 203 and/or formation of projections and depressions on the surface of first conductivity-type semiconductor layer 203 using the same laser light. The laser light may also be used to form projections and depressions on the surface of first conductivity-type semiconductor layer 203 and to form a chip division groove. Using such a method, the operation in step (I) can be simplified. In forming projections and depressions on the surface of first conductivity-type semiconductor layer 203 using laser light, it is preferable that power of laser light is adjusted as appropriate or laser light radiation is performed multiple times. Such a method can suitably be used in manufacturing a nitride semiconductor light emitting device in the following embodiments.

Next, a first electrode 216 is deposited in the vicinity of the middle of the surface of first conductivity-type semiconductor layer 203, and a second electrode 217 is deposited on that surface of second substrate 213 which is opposite to the surface on which first ohmic layer 214 is formed, resulting in a wafer having a structure shown in FIG. 2(f). First electrode 216 and second electrode 217 may be formed, for example, in a two-layer structure of a Ti layer and an Al layer.

Finally, at portions where insulating layer 208 is exposed at regular pitches, that is, any position on the bottom surface of the depression portions formed in step (B) (the dotted line in FIG. 2(f) shows the most preferable position), the above-noted wafer is divided into chips (step (F)). A diamond scribing method, a dicing method, a laser scribing method and the like may be used as a division method.

The nitride semiconductor light emitting device in the first embodiment can be manufactured as described above. One of the features of the manufacturing method is in that after a depression portion is formed from the second conductivity-type semiconductor layer 207 side (step (B)), insulating layer 208 is stacked (step (C)) and insulating layer 208 is partially removed (step (D)). As another method for covering the PN junction portion with insulating layer 208, for example, after formation of all the layers other than insulating layer 208, a chip division groove may be formed from the first conductivity-type semiconductor layer 203 side, that is, from the first electrode 216 side and thereafter insulating layer 208 may be attached to the PN junction portion. However, in such a method, the first metal layer is exposed in etching for forming a division groove and second conductivity-type semiconductor layer 207 is also etched. This results in the leak problem since whisker produced by the etching of the first metal layer comes into contact with the PN junction portion. By contrast, according to the method in this invention, such a problem does not arise since the PN junction portion has already been protected by insulating layer 208 before chip division. In addition, while the method of attaching an insulating layer only to the PN junction portion is difficult in manufacturing and is unreliable, the insulating layer formation method in accordance with the present invention ensures that the entire PN junction portion is coated more reliably.

Second Embodiment

Figure 3:
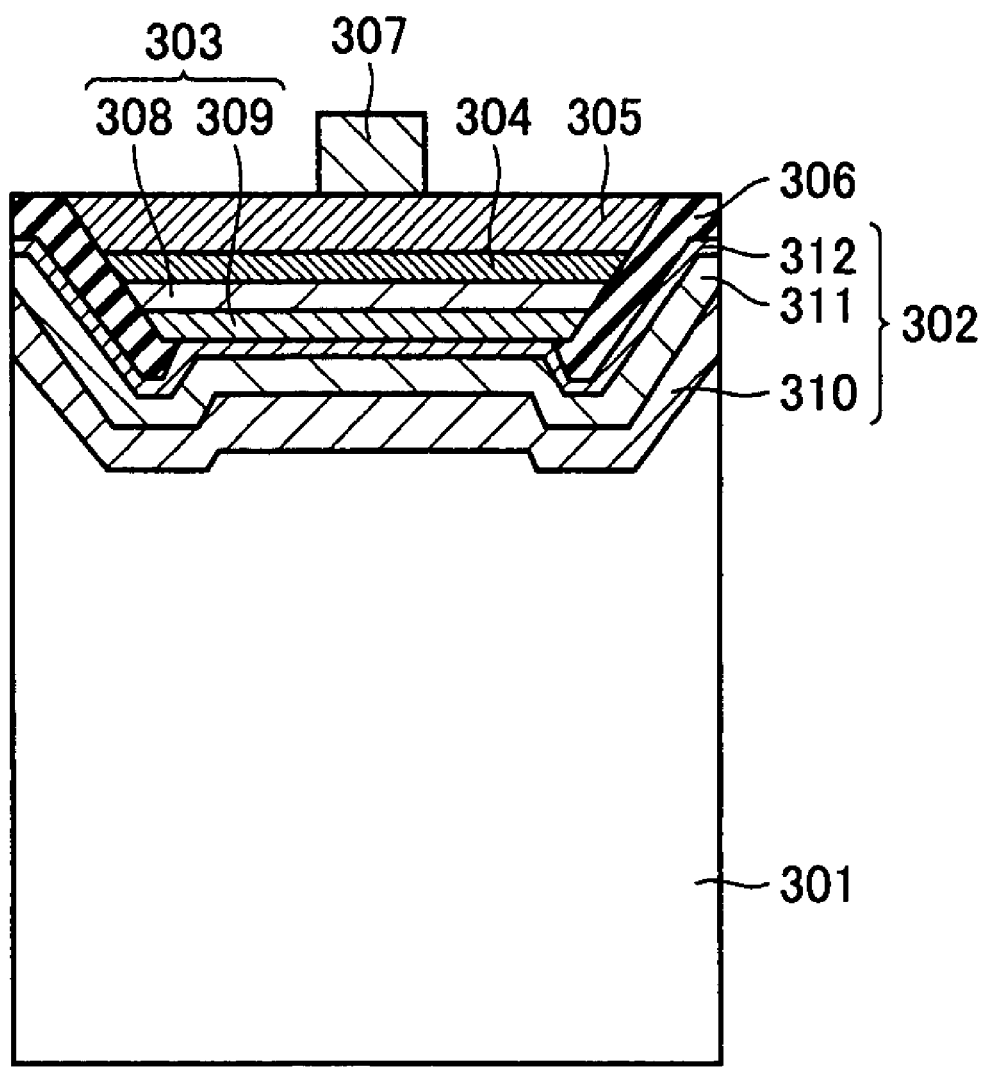
FIG. 3 is a schematic cross-sectional view showing a nitride semiconductor light emitting device in another preferable embodiment of the present invention.

FIG. 3 is a schematic cross-sectional view showing a nitride semiconductor light emitting device in another preferable embodiment of the present invention. As shown in FIG. 3, the nitride semiconductor light emitting device in the present embodiment includes a conductive substrate 301, a first metal layer 302, a second conductivity-type semiconductor layer 303, an emission layer 304, and a first conductivity-type semiconductor layer 305, in this order. In addition, the nitride semiconductor light emitting device in the present embodiment has an insulating layer 306, which covers the side surfaces of second conductivity-type semiconductor layer 303, emission layer 304 and first conductivity-type semiconductor layer 305 and, in addition, part of that surface of second conductivity-type semiconductor layer 303 which faces first metal layer 302. The nitride semiconductor light emitting device in the present embodiment has a first electrode 307 formed on first conductivity-type semiconductor layer 305. In the present embodiment, a second electrode for external connection is conductive substrate 301 itself.

In the nitride semiconductor light emitting device in the present embodiment, second conductivity-type semiconductor layer 303 is formed of a p-type AlGaN layer 308 and a p-type GaN layer 309. First metal layer 302 includes a plating underlying layer 310, a reflection layer 311, and an ohmic layer 312, in this order.

In this manner, since the PN junction portion is protected by covering the side surfaces of second conductivity-type semiconductor layer 303, emission layer 304 and first conductivity-type-semiconductor layer 305 with insulating layer 306, end-surface leak does not occur and the yield is improved. In addition, in long-term power supply metal intrusion at the PN junction portion is not observed and a reliable nitride semiconductor light emitting device is provided.

In the following, only the parts characteristic to the present embodiment will be described. The parts not described here are similar to those in the first embodiment.

<Conductive Substrate>

In the nitride semiconductor light emitting device in the present embodiment, a material used for conductive substrate 301 is a material that allows layer formation by plating. Examples of such materials are a metal or an alloy including any one of Ni, Cu, Sn, Au, and Ag as a main component. Because of using a material that allows layer formation by plating for conductive substrate 301, a conductive substrate can directly be introduced to the device, without using a method of introducing a conductive substrate by forming respective eutectic bonding layers on a conductive substrate and on a second conductivity-type semiconductor layer and bonding these eutectic bonding layer to each other, as in manufacturing the nitride semiconductor light emitting device in the first embodiment as described above.

<First Metal Layer>

First meal layer 302 includes plating underlying layer 310, reflection layer 311 and ohmic layer 312, in this order. In the following, plating underlying layer 310 will be described. Here, ohmic layer 312 corresponds to second ohmic layer 115 in the first embodiment and is in ohmic contact with second conductivity-type semiconductor layer 303.

In the present embodiment, first metal layer 302 includes plating underlying layer 310. Plating underlying layer 310 is provided and conductive substrate 301 is formed by plating with plating underlying layer 310 interposed, so that conductive substrate 301 can be formed with high yield.

A conventionally known metal or alloy can be employed to form metal underlying layer 310. Examples are Au, Ni, Pd, Cu, and an alloy including these. The thickness of plating underlying layer 310 is not particularly limited and a thickness usually used in the art may be employed. The thickness of plating underlying layer 310 may be, for example, about 10-5000 nm.

It is noted that the nitride semiconductor light emitting device in the second embodiment as describe above is susceptible to a variety of modifications without departing from the scope of the present invention. For example, first metal layer 302 may have a diffusion barrier layer. Other modifications are similar to those in the nitride semiconductor light emitting device in the first embodiment.

Now, referring to FIG. 4, a preferable method of manufacturing the nitride semiconductor light emitting device in the second embodiment as described above will be described. FIG. 4 is a schematic process view showing another preferable example of the method in the present invention. In FIG. 4, the semiconductor light emitting device is schematically shown in cross section in several steps. The method of manufacturing the nitride semiconductor light emitting device in the present embodiment includes the following steps in the following order:

(1) step (A) of stacking a first conductivity-type semiconductor layer, an emission layer, and a second conductivity-type semiconductor layer on a first substrate, in this order;

(2) step (B) of forming a plurality of depression portions at approximately regular intervals on the exposed surface of the stacked layers, each having a depth at least reaching that surface of the first conductivity-type semiconductor layer which faces the emission layer;

(3) step (C) of forming an insulating layer on the entire exposed surface of the stacked layers, including the side wall and the bottom surface of the depression portion;

(4) step (D) of exposing part of the surface of the layer in contact with the insulating layer by removing part of the insulating layer;

(5) step (E) of stacking a first metal layer and a second substrate in this order on the entire exposed surface;

(6) step (H) of removing the whole or part of the first substrate;

(7) step (I) of removing part of the first conductivity-type semiconductor layer so as to expose the bottom surface of the depression portion; and (8) step (F) of obtaining a plurality of nitride semiconductor light emitting devices by performing chip division.

The method of manufacturing the nitride semiconductor light emitting device in the second embodiment is identical to the method of manufacturing the nitride semiconductor light emitting device in the first embodiment, up to step (D). More specifically, first, for example, a sapphire substrate is prepared as a first substrate 401. Then, a buffer layer 402, a first conductivity-type semiconductor layer 403, an emission layer 404, and a second conductivity-type semiconductor layer 407 formed of a p-type AlGaN layer 405 and a p-type GaN layer 406 are grown in this order on first substrate 401 (step (A)).

Next, using the same method as in the first embodiment, second conductivity-type semiconductor layer 407, emission layer 404 and first conductivity-type semiconductor layer 403 are removed to form a plurality of depression portions (step (B)). Thereafter, an SiO$_2$ layer is formed as an insulating layer 408 (step (C)). Then, using the same method as in the first embodiment, part of insulating layer 408 formed on the surface of second conductivity-type semiconductor layer 407 is removed by etching to expose part of the surface of second conductivity-type semiconductor layer 407 (step (D)).

Then, step (E) follows in which a first metal layer and a second substrate are stacked in this order on the entire exposed surface, that is, on insulating layer 408 and on the exposed second conductivity-type semiconductor layer 407. In this step, first, as shown in FIG. 4(a), an ohmic layer 409, a reflection layer 410 and a plating underlying layer 411 are formed in this order on insulating layer 408 and on the exposed second conductivity-type semiconductor layer 407. Ohmic layer 409 is formed of, for example, Pd, Ni, Mo, Au, Fe, Cu, Zn, Al, Mg, Ti, W, Ta, Ag, and the like and is formed, for example, by evaporation. Reflection layer 410 is formed of, for example, AgNd, Ag, AgPd, AgCu, Al, and the like and is formed, for example, by sputtering. Plating underlying layer 411 is formed of, for example, Au and the like and is formed, for example, by evaporation.

Next, as shown in FIG. 4(a), a second substrate 412 is formed on plating underlying layer 411 by plating. The thickness of second substrate 412 may be, for example, 20-300 µm. The thickness of second substrate 412 is preferably 50 µm or thicker for ease of handling a chip. A metal or an alloy including any one of Ni, Cu, Sn, Au, and Ag as a main component is used for second substrate 412. The plating method may be electroless plating or electrolytic plating.

Next, first substrate 401 is removed by decomposing the whole or large part of buffer layer 402 and part of first conductivity-type semiconductor layer 403 by applying laser light of, for example, 355 nm, from the back surface of first substrate 401 (step (H)). Although first substrate 401 and the whole or a large part of buffer layer 402 is removed by laser light radiation, part of first substrate 401 may be left.

Next, part of first conductivity-type semiconductor layer 403 exposed by removing first substrate 401 and buffer layer 402 is removed by dry etching (step (I)). The removal of first conductivity-type semiconductor layer 403 is carried out so that the bottom surface of the depression portion formed in step (B) is exposed. Here, in removal of first conductivity-type semiconductor layer 403, an approximately uniform thickness of the entire first conductivity-type semiconductor layer 403 may be removed to expose the bottom surface of the depression portion, or first conductivity-type semiconductor layer 403 only on the bottom surface of the depression portion may be removed to expose the bottom surface of the depression portion. Here, the dry etching allows first conductivity-type semiconductor layer 403 to be removed and also allows projections and depressions to be formed on the surface of first conductivity-type semiconductor layer 403. Here, in this step, part of first conductivity-type semiconductor layer 403 is removed to expose the bottom surface of the depression portion, and in addition, a chip division groove for chip division in the next step is formed at the bottom surface of the depression portion. As a result of this step, the semiconductor layer portion including first conductivity-type semiconductor layer 403, emission layer 404 and second conductivity-type semiconductor layer 407 is discontinuous at regular pitches.

Next, a first electrode 413 is deposited in the vicinity of the middle of the surface of first conductivity-type semiconductor layer 403, resulting in a wafer having a structure shown in FIG. 4(b). First electrode 413 may be a two-layer structure of, for example, a Ti layer and an Al layer.

Finally, at the portions where insulating layer 408 is exposed at regular pitches, that is, any position on the bottom surface of the depression portion formed in step (B) (the dotted line in FIG. 4(b) shows the most preferable position), the above-noted wafer is divided into chips (step (F)). A diamond scribing method, a dicing method, a laser scribing method, and the like may be used as a division method.

Third Embodiment

Figure 5:
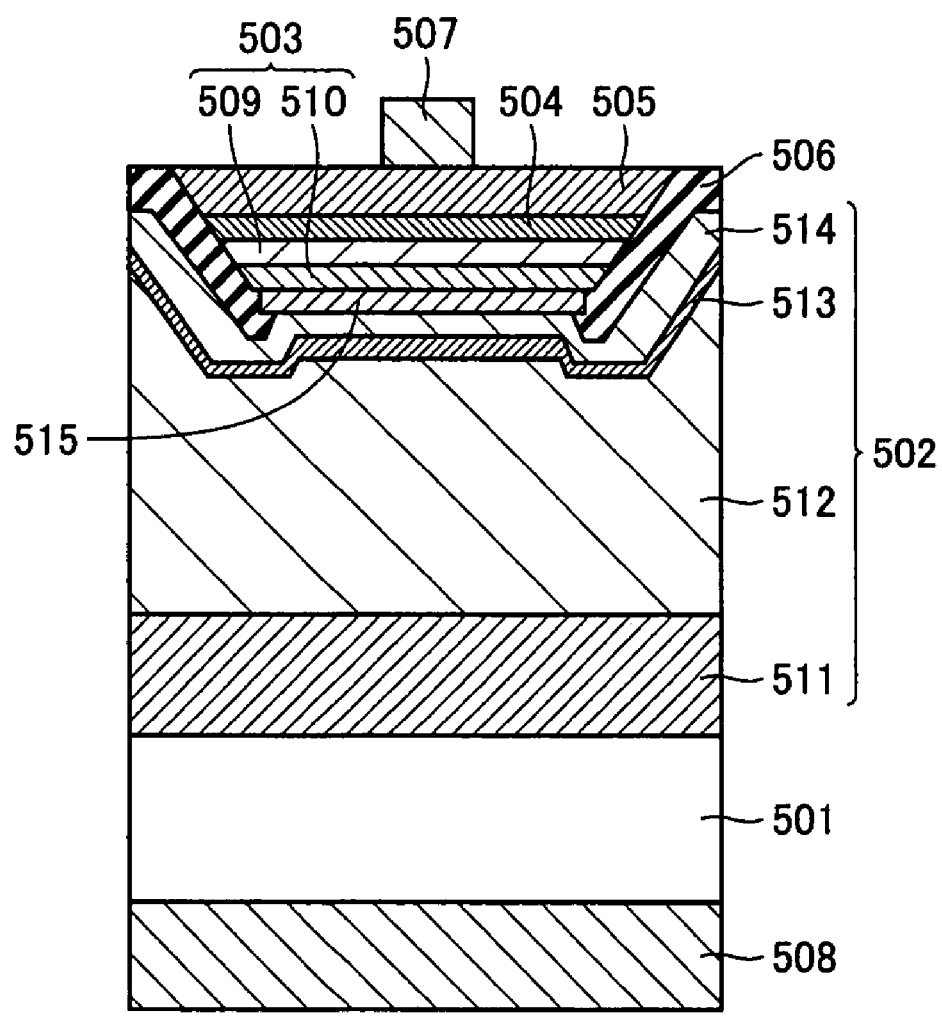
FIG. 5 is a schematic cross-sectional view showing a nitride semiconductor light emitting device in a further preferable embodiment of the present invention.

FIG. 5 is a schematic cross-sectional view showing a nitride semiconductor light emitting device in another preferable embodiment of the present invention. As shown in FIG. 5, the nitride semiconductor light emitting device in the present embodiment includes a conductive substrate 501, a first metal layer 502, a second metal layer 515, a second conductivity-type semiconductor layer 503, an emission layer 504, and a first conductivity-type semiconductor layer 505, in this order. In addition, the nitride semiconductor light emitting device in the present embodiment has an insulating layer 506, which covers the side surfaces of second metal layer 515, second conductivity-type semiconductor layer 503, emission layer 504 and first conductivity-type semiconductor layer 505 and part of that surface of second metal layer 515 which faces first metal layer 502. The nitride semiconductor light emitting device in the present embodiment has a first electrode 507 for external connection formed on first conductivity-type semiconductor layer 505 and a second electrode 508 for external connection formed on that surface of conductive substrate 501 which is opposite to the surface on which first metal layer 502 is formed.

In the nitride semiconductor light emitting device in the present embodiment, second conductivity-type semiconductor layer 503 is formed of a p-type AlGaN layer 509 and a p-type GaN layer 510. First metal layer 502 includes a first ohmic layer 511, a eutectic bonding layer 512, a diffusion barrier layer 513, and a reflection layer 514, in this order. Second metal layer 515 is in contact with reflection layer 514 included in first metal layer 502. In the present embodiment, the length in the layer direction (the lateral direction) of second metal layer 515 on the side in contact with second conductivity-type semiconductor layer 503 is shorter than the length in the layer direction (lateral direction) of second conductivity-type semiconductor layer 503 on the side in contact with second metal layer 515.

In this manner, since the PN junction portion is protected by covering the side surfaces of second metal layer 515, second conductivity-type semiconductor layer 503, emission layer 504 and first conductivity-type semiconductor layer 505 with insulating layer 506, end-surface leak does not occur and the yield is improved. In addition, in long-term power supply, metal intrusion at the PN junction portion is not observed and a reliable nitride semiconductor light emitting device is provided.

The difference between the structure of the nitride semiconductor light emitting device in the present invention shown in FIG. 1 and the nitride semiconductor light emitting device in the present invention shown in FIG. 5 will be described. In the nitride semiconductor light emitting device in FIG. 1, current tends not to spread at that part of second conductivity-type semiconductor layer 103 which is coated with insulating layer 106. On the other hand, in the nitride semiconductor light emitting device in FIG. 5, second metal layer 515 is formed inside of insulating layer 506, that is, between insulating layer 506 covering part of the surface of second metal layer 515 and second conductivity-type semiconductor layer 503. Therefore, even in the case where the contact area between second metal layer 515 and first metal layer 502 is very small (in other words, the coated area with insulating layer 506, of the surface of second metal layer 515, is very large), the contact area between second metal layer 515 and second conductivity-type semiconductor layer 503 is secured, thereby allowing current to spread over the entire second conductivity-type semiconductor layer 503.

In the following, only the parts characteristic to the present embodiment will be described. The parts not described here are similar to those in the first embodiment.

<First Metal Layer>

First meal layer 502 in the present embodiment includes first ohmic layer 511, eutectic bonding layer 512, diffusion barrier layer 513, and reflection layer 514, in this order, as described above. First ohmic layer 511 corresponds to first ohmic layer 111 in the nitride semiconductor light emitting device in the first embodiment and is in ohmic contact with conductive substrate 501.

Here, a counterpart to second ohmic layer 115 in the nitride semiconductor light emitting device in the first embodiment does not exist in first metal layer 502 of the nitride semiconductor light emitting device in the present embodiment. This is because second metal layer 515 includes an ohmic layer serving as a replacement.

<Second Metal Layer>

Second metal layer 515 in the present embodiment includes an ohmic layer in ohmic contact with p-type GaN layer 510 of second conductivity-type semiconductor layer 503. For example, Pd, Ni, Pt, Ag, and an alloy including them can be used for the ohmic layer. The thickness of the ohmic layer is not particularly limited and may be, for example, 0.5-100 nm. Preferably, the thickness is reduced in a case of a material having low reflectivity, and the thickness is increased in a case of a material having high reflectivity.

Here, as shown in FIG. 5, the length in the layer direction (lateral direction) (that is, the length in the direction vertical to the layer thickness direction) of the ohmic layer as second metal layer 515 on the p-type GaN layer 510 side is preferably shorter than the length in the layer direction (lateral direction) of p-type GaN layer 510 on the second metal layer 515 side. Thus, leak current is further reduced and the yield is increased.

<Insulating Layer>

Insulating layer 506 covers the side surfaces of second metal layer 515, second conductivity-type semiconductor layer 503, emission layer 504 and first conductivity-type semiconductor layer 505. Because of such a configuration, the PN junction portion is protected, so that end surface leak is not produced and the yield is improved. In addition, in long-term power supply, metal intrusion at the PN junction portion is not observed and a reliable nitride semiconductor light emitting device is provided.

Insulating layer 506 covers the side surfaces of second metal layer 515, second conductivity-type semiconductor layer 503, emission layer 504 and first conductivity-type semiconductor layer 505 and additionally covers part of that surface of second metal layer 515 which is in contact with first metal layer 502, similarly to the aforementioned embodiment.

When insulating layer 506 covers part of that surface of second metal layer 515 which is in contact with first metal layer 502, the area where that surface of second metal layer 515 which is in contact with first metal layer 502 is covered with insulating layer 506 is preferably 1-99% of the entire surface of second metal layer 515 which is in contact with first metal layer 502. In the present embodiment, as described above, second metal layer 515 is formed on the inside of insulating layer 506, more specifically, between insulating layer 506 covering part of the surface of second metal layer 515 and second conductivity-type semiconductor layer 503. Therefore, even when the degree of coating with insulating layer 506 is large, current spreads in second metal layer 515 and current is injected to the entire second conductivity-type semiconductor layer 503. However, if the coating area is larger than 99%, contact between first metal layer 502 and second metal layer 515 becomes poor, possibly reducing the yield. On the other hand, if the coating area is less than 1%, poor alignment takes place in the step of partially removing insulating layer 506 formed on the entire surface of second metal layer 515, as described later, so that the yield tends to be reduced to some extent. However, the coating area of less than 1%, for example, ultimately 0%, does not depart from the scope of the present invention, and the effect as described above is fully achieved as long as insulating layer 506 at least covers the side surfaces of second metal layer 515, second conductivity-type semiconductor layer 503, emission layer 504 and first conductivity-type semiconductor layer 505.

It is noted that the nitride semiconductor light emitting device in the third embodiment as describe above is susceptible to a variety of modifications without departing from the scope of the present invention. For example, second metal layer 515 may include not only an ohmic layer but also one or more kinds of a reflection layer, a diffusion barrier layer, and a eutectic bonding layer, similarly to first metal layer 502. Accordingly, it is possible to obtain a reliable light emitting device with high emission efficiency. When second metal layer 515 does not include an ohmic layer, first metal layer 502 may include an ohmic layer different from first ohmic layer 511.

As a specific example of a modification of the nitride semiconductor light emitting device in the third embodiment as described above, the following modification may be contemplated. Specifically, referring to FIG. 5 for illustration, the device may be structured such that second metal layer 515 includes an ohmic layer and a reflection layer (the ohmic layer faces second conductivity-type semiconductor layer 503) and first metal layer 502 does not include diffusion barrier layer 513 and reflection layer 514 and only includes first ohmic layer 511 and eutectic bonding layer 512. Second metal layer 515 may additionally include a diffusion barrier layer and a eutectic bonding layer. In such a structure, by making the area large enough in which insulating layer 506 covers the surface of the reflection layer of metal layer 515, the metal of eutectic bonding layer 512 and the metal of the reflection layer of second metal layer 515 are mixed to each other at the opening portion of insulating layer 506. However, in other regions, insulating layer 506 also functions as a diffusion barrier layer, so that reduction in reflectivity due to mutual diffusion of metals can be prevented. Here, the area in which insulating layer 506 covers the surface of the reflection layer of second metal layer 515 may be 99% or less of the entire surface. Preferably, it is about 95%. When insulating layer 506 functions as a diffusion barrier layer in this manner, the thickness of insulating layer 506 may be 30-3000 nm.

Here, even when the area in which insulating layer 506 covers the surface of the reflection layer of second metal layer 515 is large enough (for example, about 95% of the entire surface), that is, when the opening portion of insulating layer 506 is small enough, the reflectivity is reduced in the opening portion thereby reducing the light extraction efficiency. Therefore, a current blocking layer as described above is preferably used at the same time. Thus, emission does not take place in the portion where the reflectivity is reduced, so that the opening portion with low reflectivity does not affect the light extraction efficiency and the light extraction efficiency can be further improved. The other possible modifications of the present embodiment are similar to those in the first embodiment.

Now, referring to FIG. 6, a preferable method of manufacturing the nitride semiconductor light emitting device in the third embodiment as described above will be described. FIG. 6 is a schematic process view showing another preferable example of the method in the present invention. In FIG. 6, the semiconductor light emitting device is schematically shown in cross section in several steps. The method of manufacturing the nitride semiconductor light emitting device in the present embodiment includes the following steps in the following order:

(1) step (A) of stacking a first conductivity-type semiconductor layer, an emission layer, and a second conductivity-type semiconductor layer on a first substrate, in this order;

(2) step (G) of stacking a second metal layer;

(3) step (B) of forming a plurality of depression portions at approximately regular intervals on the exposed surface of the stacked layers, each having a depth at least reaching that surface of the first conductivity-type semiconductor layer which faces the emission layer;

(4) step (C) of forming an insulating layer on the entire exposed surface of the stacked layers, including the side wall and the bottom surface of the depression portion;

(5) step (D) of exposing part of the surface of the layer in contact with the insulating layer by removing part of the insulating layer;

(6) step (E) of stacking a first metal layer and a second substrate in this order on the entire exposed surface;

(7) step (H) of removing the whole or part of the first substrate;

(8) step (I) of removing part of the first conductivity-type semiconductor layer so as to expose the bottom surface of the depression portion; and (9) step (F) of obtaining a plurality of nitride semiconductor light emitting devices by performing chip division.

In the method of manufacturing the nitride semiconductor light emitting device in the third embodiment as described above, first, for example, a sapphire substrate is prepared as a first substrate 601. Then, a buffer layer 602 made of $Al_rGa_{1-r}N$ ($0 \leq r \leq 1$), an n-type GaN layer as a first conductivity-type semiconductor layer 603, an emission layer 604 formed of a barrier layer made of GaN and a well layer made of $In_qGa_{1-q}N$ ($0 \leq q \leq 1$), and a second conductivity-type semiconductor layer 607 formed of a p-type AlGaN layer 605 and a p-type GaN layer 606 are grown in this order on first substrate 601 (step (A)).

Next, a second metal layer 608 is stacked on the entire surface of second conductivity-type semiconductor layer 607 by evaporation (step (G)). For example, Pd, Ni, Mo, Au, Fe, Cu, Zn, Al, Mg, Ti, W, Ta, Ag, and the like are used for second metal layer 608. In the present embodiment, second metal layer 608 is an ohmic layer that forms an ohmic junction with p-type GaN layer 606.

Then, after an approximately square photoresist mask is formed at a regular pitch, second metal layer 608 is etched at the exposed portion. In doing this, under appropriate etching conditions, second metal layer 608 is overetched a few μm inside from the end portion of the photoresist mask. Accordingly, leak current is further reduced and the yield is increased.

Next, the photoresist used in the etching of second metal layer 608 is used as it is to remove second conductivity-type semiconductor layer 607, emission layer 604, and first conductivity-type semiconductor layer 603 in the part not covered with the photoresist, by dry etching, whereby a plurality of depression portions are formed at approximately regular intervals corresponding to regular pitches of the photoresist mask (step (B)). The depth of the depression portion is preferably set to such an extent that it passes through emission layer 604 and reaches first conductivity-type semiconductor layer 603 but does not pass through first conductivity-type semiconductor layer 603. Here, because of using a photoresist as a mask, the depression portion is formed like an approximately inversed trapezoid, so that the nitride semiconductor layer potion after etching, specifically, the second conductivity-type semiconductor layer 607, emission layer 604 and first conductivity-type semiconductor layer 603 portion becomes a tapered structure. Since second metal layer 608 is a few μm inside from the photoresist end portion by overetching, second metal layer 608 is not exposed even in the tapered structure. Here, the aforementioned step (G) may be performed after the step (B).

Next, after removal of the photoresist, an $SiO_2$ layer is formed as an insulating layer 609 to continuously cover the entire surface, namely, the surface of second metal layer 608, the side surfaces of second conductivity-type semiconductor layer 607, emission layer 604 and first conductivity-type semiconductor layer 603 exposed in step (B) which corresponds to the side wall of the depression portion, and the surface of first conductivity-type semiconductor layer 603 exposed in step (B) which corresponds to the bottom surface of the depression portion (step (C)). Then, part of insulating layer 609 formed on the surface of second metal layer 608 is removed by etching to expose part of the surface of second metal layer 608 which is a layer in contact with insulating layer 609 (step (D)). Here, a photoresist mask is used for etching. Etching is preferably dry etching. In the case where insulating layer 609 is removed by dry etching, second metal layer 608 functions as an etching stop player. The etching is preferably performed so that the area in which the surface of second metal layer 608 is coated is 1-99% of the entire surface of second metal layer 608 which is opposite to the surface on which emission layer 604 is formed.

Then, step (E) follows in which a first metal layer and a second substrate are stacked in this order on the entire exposed surface, that is, on insulating layer 609 and on the exposed second metal layer 608. In this step, first, as shown in FIG. 6(a), a reflection layer 610, a diffusion barrier layer 611 and a first eutectic bonding layer 612 are formed in this order on insulating layer 609 and on the exposed second metal layer 608. Reflection layer 610 is formed, for example, of AgNd, Ag, AgPd, AgCu, Al, and the like and is formed, for example, by sputtering. Diffusion barrier layer 611 is formed of, for example, NiTi, Ti, Ni, W, Mo, Nb, Ta, and the like and is formed, for example, by sputtering. First eutectic bonding layer 612 is formed of, for example, Au and the like and is formed, for example, by evaporation.

Next, as shown in FIG. 6(a), after a first ohmic layer 614 is formed on a second substrate 613, such as an Si substrate, for example, by means usually used in the art, a second eutectic bonding layer 615 is formed thereon. First ohmic layer 614 may be a two-layer structure of, for example, a Ti layer and an Au layer. Second eutectic bonding layer 615 is formed of, for example, AuSn and is formed by evaporation. Here, the formation of first ohmic layer 614 and second eutectic bonding layer 615 on second substrate 613 may be carried out at any timing before formation of first eutectic bonding layer 612 is completed or may be carried out simultaneously with or after completion of the formation of first eutectic bonding layer 612.

Next, first eutectic bonding layer 612 and second eutectic bonding layer 615 are brought into contact and bonded with each other similarly to the first embodiment.

Next, first substrate 601 is removed by decomposing the whole or large part of buffer layer 602 and part of first conductivity-type semiconductor layer 603 by applying laser light of, for example, 266 nm, from the back surface of first substrate 601 (step (H)). Although first substrate 601 and the whole or a large part of buffer layer 602 are removed by laser light radiation, part of first substrate 601 may be left.

Next, part of first conductivity-type semiconductor layer 603 exposed by removing first substrate 601 and buffer layer 602 is removed by dry etching (step (I)). The removal of first conductivity-type semiconductor layer 603 is carried out in such a manner that the bottom surface of the depression portion formed in step (B) is exposed. Here, in removal of first conductivity-type semiconductor layer 603, an approximately uniform thickness of the entire first conductivity-type semiconductor layer 603 may be removed to expose the bottom surface of the depression portion, or first conductivity-type semiconductor layer 603 only on the bottom surface of the depression portion may be removed to expose the bottom surface of the depression portion. Here, the dry etching allows first conductivity-type semiconductor layer 603 to be removed and also allows projections and depressions to be formed on the surface of first conductivity-type semiconductor layer 603. Here, in this step, part of first conductivity-type semiconductor layer 603 is removed to expose the bottom surface of the depression portion, and in addition, a chip division groove for chip division in the next step is formed at the bottom surface of the depression portion. As a result of this step, the semiconductor layer portion including first conductivity-type semiconductor layer 603, emission layer 604 and second conductivity-type semiconductor layer 607 is discontinuous at regular pitches.

Next, a first electrode 616 for external connection is deposited in the vicinity of the middle of the surface of first conductivity-type semiconductor layer 603, and a second electrode 617 for external connection is deposited on that surface of second substrate 613 which is opposite to the surface on which first ohmic layer 614 is formed, resulting in a wafer having a structure shown in FIG. 6(b). First electrode 616 and second electrode 617 may be a two-layer structure of, for example, a Ti layer and an Al layer.

Finally, at the portions where insulating layer 609 is exposed at regular pitches, that is, any position on the bottom surface of the depression portion formed in step (B) (the dotted line in FIG. 6(b) shows the most preferable position), the above-noted wafer is divided into chips (step (F)). A diamond scribing method, a dicing method, a laser scribing method, and the like may be used as a division method.

Referring now to FIG. 7, another preferable method of manufacturing the nitride semiconductor light emitting device in the third embodiment as described above will be described. FIG. 7 is a schematic process view showing another preferable example of the method of the present invention. In FIG. 7, the semiconductor light emitting device in several steps is schematically shown in cross section.

First, similarly to the method shown in FIG. 6, a buffer layer 702, a first conductivity-type semiconductor layer 703, an emission layer 704, and a second conductivity-type semiconductor layer 707 formed of a p-type AlGaN layer 705 and a p-type GaN layer 706 are grown in this order on a first substrate 701 (step (A)). Thereafter, a second metal layer 708 is stacked on the entire surface of second conductivity-type semiconductor layer 707 by evaporation (step (G)).

Next, similarly to the method shown in FIG. 6, after second metal layer 708 is etched, the photoresist mask used in the etching of second metal layer 708 is used as it is to remove second conductivity-type semiconductor layer 707, emission layer 704 and first conductivity-type semiconductor layer 703 in the part not covered with the photoresist, whereby a plurality of depression portions are formed at approximately regular intervals corresponding to the regular pitches of the photoresist mask (step (B)).

Next, after removal of the photoresist, similarly to the method shown in FIG. 6, an $SiO_2$ layer is formed as an insulating layer 709 to continuously cover the surface of second metal layer 708, the side surfaces of second conductivity-type semiconductor layer 707, emission layer 704 and first conductivity-type semiconductor layer 703 exposed in step (B) which corresponds to the side wall of the depression portion, and the surface of first conductivity-type semiconductor layer 703 exposed in step (B) which corresponds to the bottom surface of the depression portion (step (C)). Then, part of insulating layer 709 formed on the surface of second metal layer 708 is removed by etching to expose part of the surface of second metal layer 708 which is a layer in contact with insulating layer 709 (step (D)). Here, a photoresist mask is used in the etching.

Next, the photoresist mask for etching is removed, and a photoresist mask is formed having approximately square holes at regular pitches, for example, about a few hundreds of μm, each having a side shorter than the pitch length, in order to partially form a first metal layer by lift-off. Here, the center of the approximately square hole is matched with the center of the exposed portion of second metal layer 708.

Then, step (E) follows in which a first metal layer and a second substrate are stacked in this order on the entire exposed surface, that is, on insulating layer 709 and on the exposed second metal layer 708. In this step, first, as shown in FIG. 7(a), a reflection layer 710, a diffusion barrier layer 711 and a first eutectic bonding layer 712 are formed in this order on insulating layer 709 and on the exposed second metal layer 708. Thereafter, lift-off is performed. In this manner, because of using a photoresist mask in formation of the first metal layer, the first metal layer can be formed in a discontinuous manner with regular intervals corresponding to the pitches of the formed photoresist mask and with the length corresponding to the size of the hole of the photoresist mask. The center position of the first metal layer is roughly matched with the center position of second metal layer 708 since the center of the hole of the photoresist mask is matched with the center of the exposed portion of second metal layer 708. In addition, because of using a photoresist mask, as shown in FIG. 7(a), a portion in which no layer is formed is produced on insulating layer 709. This portion is a preferable portion as a chip division position.

Next, as shown in FIG. 7(a), a second substrate 713, such as an Si substrate, for example, is prepared, and after a photoresist mask having a hole with the same size as that of the photoresist mask used in formation of the first metal layer is formed, a first ohmic layer 714 is formed on second substrate 713 and a second eutectic bonding layer 715 is formed thereon. Then, lift-off is performed. Using a photoresist mask, similarly to the formation of the first metal layer, first ohmic layer 714 and second eutectic bonding layer 715 are formed in a discontinuous manner at regular intervals corresponding to the pitches of the formed photoresist mask and with the length corresponding to the size of the hole of the photoresist mask.

Then, first eutectic bonding layer 712 and second eutectic bonding layer 715 are aligned, brought into contact to generally overlap each other, and bonded to each other by thermocompression bonding.

The following steps are similar to those in the method shown in FIG. 6. Specifically, the whole or part of first substrate 701 is removed (step (H)), and projections and depressions are formed on the surface of first conductivity-type semiconductor layer 703 by dry etching. Then, first electrode 716 and second electrode 717 are formed, resulting in a wafer having the structure in FIG. 7(b). Finally, chip division is performed (step (F)). Here, the position of chip division is at a portion where insulating layer 709 is exposed, of any position on the bottom surface of the depression portion formed in step (B) (the dotted line in FIG. 7(b) shows the most preferable position).

As described above, in this method, a photoresist mask is used to form the first metal layer, first ohmic layer 714 and second eutectic bonding layer 715 in a discontinuous manner. Here, in FIG. 7(b), the bottom surface of the depression portion formed in step (B) is exposed. However, according to this method, it is not always necessary to provide step (I) of removing part of first conductivity-type semiconductor layer 703 to expose insulating layer 709 (that is, the bottom surface of the depression portion). This is because no metal layer is present in the chip division region and thus there is no possibility of leak due to metal intrusion. Such a method can preferably be used in manufacturing a nitride semiconductor light emitting device in other embodiments in the present specification.

Fourth Embodiment

Figure 8:
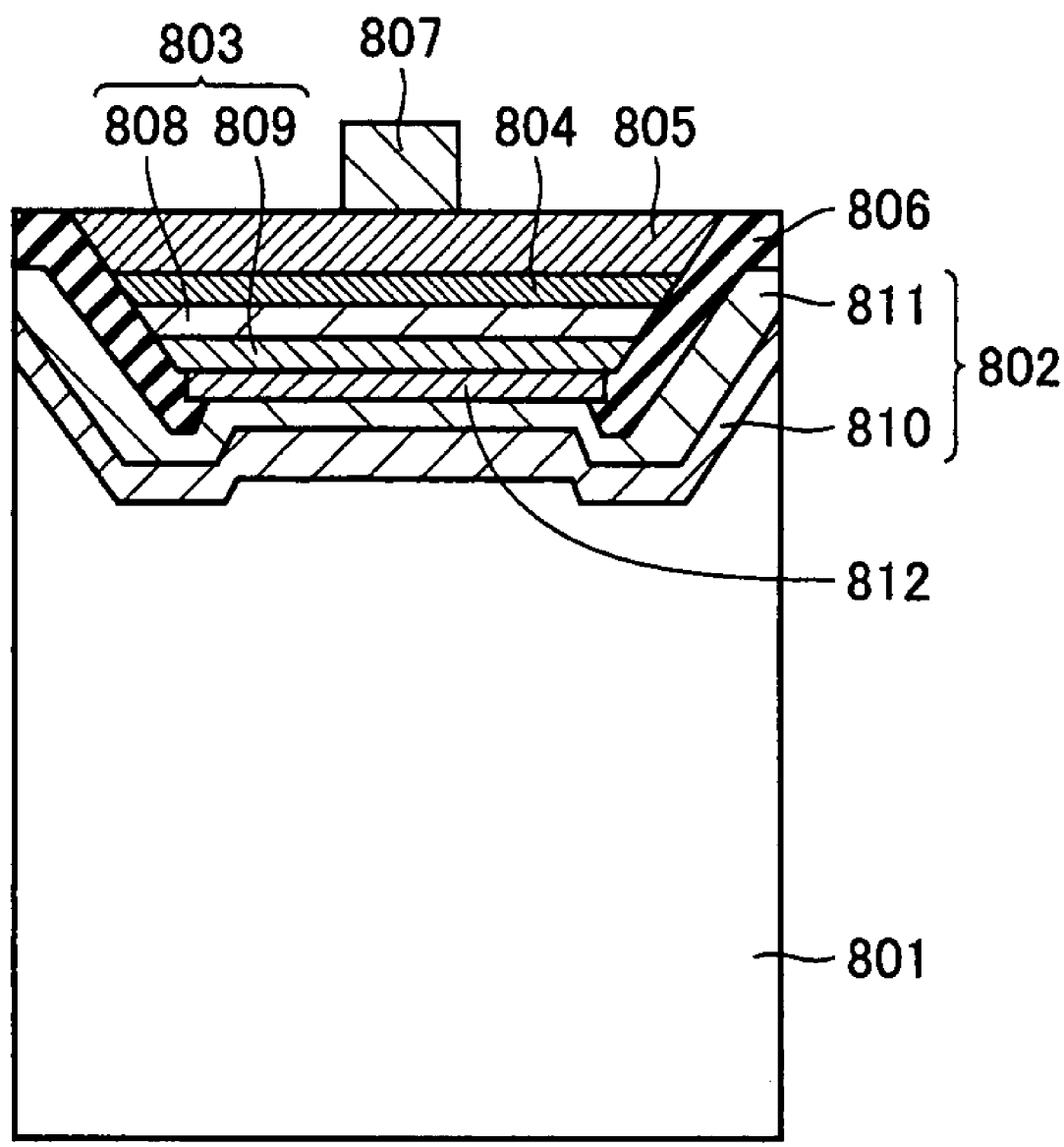
FIG. 8 is a schematic cross-sectional view showing a nitride semiconductor light emitting device in yet another preferable embodiment of the present invention.

FIG. 8 is a schematic cross-sectional view showing a nitride semiconductor light emitting device in another preferable embodiment of the present invention. As shown in FIG. 8, the nitride semiconductor light emitting device in the present embodiment is formed by providing a second metal layer employed in the third embodiment in the nitride semiconductor light emitting device in the second embodiment. More specifically, the nitride semiconductor light emitting device in the present embodiment includes a conductive substrate 801, a first metal layer 802, a second metal layer 812, a second conductivity-type semiconductor layer 803, an emission layer 804, and a first conductivity-type semiconductor layer 805, in this order. In addition, the nitride semiconductor light emitting device in the present embodiment has an insulating layer 806, which covers the side surfaces of second metal layer 812, second conductivity-type semiconductor layer 803, emission layer 804 and first conductivity-type semiconductor layer 805 and part of that surface of second metal layer 812 which is in contact with first metal layer 802. The nitride semiconductor light emitting device in the present embodiment has a first electrode 807 for external connection formed on first conductivity-type semiconductor layer 805. In the present embodiment, a second electrode for external connection is conductive substrate 801 itself.

Here, in the nitride semiconductor light emitting device in the present embodiment, second conductivity-type semiconductor layer 803 is formed of a p-type AlGaN layer 808 and a p-type GaN layer 809. First metal layer 802 includes a plating underlying layer 810 and a reflection layer 811, in this order. Second metal layer 812 is in contact with reflection layer 811 included in first metal layer 802.

In this manner, since the PN junction portion is protected by covering the side surfaces of second metal layer 812, second conductivity-type semiconductor layer 803, emission layer 804 and first conductivity-type semiconductor layer 805 with insulating layer 806, end-surface leak does not occur and the yield is improved. In addition, in long-term power supply, metal intrusion at the PN junction portion is not observed and a reliable nitride semiconductor light emitting device is provided. Furthermore, the effect brought about by provision of second metal layer 812 is similar as in the third embodiment.

It is noted that the nitride semiconductor light emitting device in the fourth embodiment as describe above is susceptible to a variety of modifications without departing from the scope of the present invention. For example, second metal layer 812 may include not only an ohmic layer but also one or more kinds of a reflection layer, a diffusion barrier layer, and a eutectic bonding layer, similarly to first metal layer 802. Accordingly, it is possible to obtain a reliable light emitting device with higher emission efficiency. Other possible modifications are similar to those in the second embodiment.

Now, referring to FIG. 9, a preferable method of manufacturing the nitride semiconductor light emitting device in the fourth embodiment as described above will be described. FIG. 9 is a schematic process view showing another preferable example of the method in the present invention. In FIG. 9, the semiconductor light emitting device is schematically shown in cross section in several steps. The method of manufacturing the nitride semiconductor light emitting device in the present embodiment includes the following steps in the following order:

(1) step (A) of stacking a first conductivity-type semiconductor layer, an emission layer, and a second conductivity-type semiconductor layer on a first substrate, in this order;

(2) step (G) of stacking a second metal layer;

(3) step (B) of forming a plurality of depression portions at approximately regular intervals on the exposed surface of the stacked layers, each having a depth at least reaching that surface of the first conductivity-type semiconductor layer which faces the emission layer;

(4) step (C) of forming an insulating layer on the entire exposed surface of the stacked layers, including the side wall and the bottom surface of the depression portion;

(5) step (D) of exposing part of the surface of the layer in contact with the insulating layer by removing part of the insulating layer;

(6) step (E) of stacking a first metal layer and a second substrate in this order on the entire exposed surface;

(7) step (H) of removing the whole or part of the first substrate;

(8) step (I) of removing part of the first conductivity-type semiconductor layer so as to expose the bottom surface of the depression portion; and (9) step (F) of obtaining a plurality of nitride semiconductor light emitting devices by performing chip division.

The method of manufacturing the nitride semiconductor light emitting device in the fourth embodiment is identical to the method of manufacturing the nitride semiconductor light emitting device in the third embodiment, up to step (D). More specifically, first, for example, a sapphire substrate is prepared as a first substrate 901. Then, a buffer layer 902, a first conductivity-type semiconductor layer 903, an emission layer 904, and a second conductivity-type semiconductor layer 907 formed of a p-type AlGaN layer 905 and a p-type GaN layer 906 are grown in this order on first substrate 901 (step (A)). Then, using the same method as in the third embodiment, a second metal layer 908 formed of, for example, Pd is stacked (step (G)), and second metal layer 908 is etched. Then, using the same method as in the third embodiment, second conductivity-type semiconductor layer 907, emission layer 904, and first conductivity-type semiconductor layer 903 are removed to form a depression portion (step (B)), and thereafter an $SiO_2$ layer is formed as an insulating layer 909 (step (C)). Here, the aforementioned step (G) may be performed after the step (B).

Next, using the same method as in the third embodiment, part of insulating layer 909 formed on the surface of second metal layer 908 is removed by etching to expose part of the surface of second metal layer 908 (step (D)).

Then, step (E) follows in which a first metal layer and a second substrate are stacked in this order on the entire exposed surface, that is, on insulating layer 909 and on the exposed second metal layer 908. In this step, first, as shown in FIG. 9(a), a reflection layer 910 and a plating underlying layer 911 are formed in this order on insulating layer 909 and on the exposed second metal layer 908. Reflection layer 910 is formed of, for example, AgNd, Ag, AgPd, AgCu, Al, and the like and is formed, for example, by sputtering. Plating underlying layer 911 is formed, for example, of Au, and is formed, for example, by evaporation.

Next, as shown in FIG. 9(a), a second substrate 912 is formed by plating on plating underlying layer 911. The thickness of second substrate 912 may be, for example, 20-300 µm. In terms of ease of handling a chip, the thickness of second substrate 912 is preferably 50 µm or more. A metal or an alloy or the like including any one of Ni, Cu, Sn, Au, Ag as a main component is used for second substrate 912. The plating method may be electroless plating or electrolytic plating.

Next, first substrate 901 is removed by decomposing the whole or large part of buffer layer 902 and part of first conductivity-type semiconductor layer 903 by applying laser light of, for example, 355 nm, from the back surface of first substrate 901 (step (H)). Although first substrate 901 and the whole or a large part of buffer layer 902 are removed by laser light radiation, part of first substrate 901 may be left.

Next, part of first conductivity-type semiconductor layer 903 exposed by removing first substrate 901 and buffer layer 902 is removed by dry etching (step (I)). The removal of first conductivity-type semiconductor layer 903 is carried out so that the bottom surface of the depression portion formed in step (B) is exposed. Here, in removal of first conductivity-type semiconductor layer 903, an approximately uniform thickness of the entire first conductivity-type semiconductor layer 903 may be removed to expose the bottom surface of the depression portion, or first conductivity-type semiconductor layer 903 only on the bottom surface of the depression portion may be removed to expose the bottom surface of the depression portion. Here, the dry etching allows first conductivity-type semiconductor layer 903 to be removed and also allows projections and depressions to be formed on the surface of first conductivity-type semiconductor layer 903. Here, in this step, part of first conductivity-type semiconductor layer 903 is removed to expose the bottom surface of the depression portion, and in addition, a chip division groove for chip division in the next step is formed at the bottom surface of the depression portion. As a result of this step, the semiconductor layer portion including first conductivity-type semiconductor layer 903, emission layer 904 and second conductivity-type semiconductor layer 907 is discontinuous at regular pitches.

Next, a first electrode 913 for external connection is deposited in the vicinity of the middle of the surface of first conductivity-type semiconductor layer 903, resulting in a wafer having a structure shown in FIG. 9(b). First electrode 913 for external connection may be a two-layer structure of, for example, a Ti layer and an Al layer.

Finally, at the portions where insulating layer 909 is exposed at regular pitches, that is, any position on the bottom surface of the depression portion formed in step (B) (the dotted line in FIG. 9(b) shows the most preferable position), the above-noted wafer is divided into chips (step (F)). A diamond scribing method, a dicing method, a laser scribing method, and the like may be used as a division method.

In the following, the present invention will be described in more detail with reference to examples. However, the present invention is not limited thereto.

EXAMPLE

Example 1

A nitride semiconductor light emitting device was fabricated by the following method. For convenience of explanation, the description will be made with reference to FIG. 2. First, a sapphire substrate was prepared as first substrate 201. Then, 50 nm-thick buffer layer 202 made of $Al_rGa_{1-r}N$ ($0 \leq r \leq 1$), 5 μm-thick first conductivity-type semiconductor layer 203 as an n-type GaN layer, 100 nm-thick emission layer 204 including a barrier layer made of GaN and a well layer made of $In_qGa_{1-q}N$ ($0 \leq q \leq 1$), and second conductivity-type semiconductor layer 207 formed of 30 nm-thick p-type AlGaN layer 205 and 200-nm thick p-type GaN layer 206 were grown in this order on first substrate 201 according to the usual manner (step (A)).

Next, after an approximately square photoresist mask, 250 μm per side, was formed at a 350 μm pitch, for the portion that was not covered with the photoresist, second conductivity-type semiconductor layer 207, emission layer 204 and first conductivity-type semiconductor layer 203 were removed by dry etching, as shown in FIG. 2(a), whereby a plurality of depression portions each shaped like a inversed trapezoid were formed at approximately regular intervals corresponding to the regular pitches of the photoresist mask (step (B)). The depth of the depression portion was 4 μm from that surface of emission layer 204 on which first conductivity-type semiconductor layer 203 was formed.

Next, after removal of the photoresist, as shown in FIG. 2(b), an $SiO_2$ layer was formed as insulating layer 208 to continuously cover the entire surface, namely, the surface of second conductivity-type semiconductor layer 207, the side surfaces of second conductivity-type semiconductor layer 207, emission layer 204 and first conductivity-type semiconductor layer 203 exposed in step (B) corresponding to the side wall of the depression portion, and the surface of first conductivity-type semiconductor layer 203 exposed in step (B) corresponding to the bottom surface of the depression portion (step (C)). Then, as shown in FIG. 2(c), part of insulating layer 208 formed on the surface of second conductivity-type semiconductor layer 207 was removed by etching to expose part of the surface of second conductivity-type semiconductor layer 207 (step (D)).

Then, step (E) was performed in which a first metal layer and a second substrate were stacked in this order on the entire exposed surface, that is, on insulating layer 208 and on the exposed second conductivity-type semiconductor layer 207. In this step, first, as shown in FIG. 2(d), Pd of 1.5 nm was deposited as second ohmic layer 209 on insulating layer 208 and on the exposed second conductivity-type semiconductor layer 207. Then, an AgNd layer was formed at a thickness of 100 nm as reflection layer 210 by sputtering. Then, an NiTi layer was formed at a thickness of 15 nm as diffusion barrier layer 211 by sputtering. Then, Au of 1 μm was deposited as first eutectic bonding layer 212.

Next, as shown in FIG. 2(d), a 10 nm-thick Ti layer and then a 200 nm-thick Au layer were formed as first ohmic layer 214 according to the usual manner on second substrate 213 which was an Si substrate, and AuSn of 1 μm was thereafter deposited thereon as second eutectic bonding layer 215.

Next, first eutectic bonding layer 212 and second eutectic bonding layer 215 were brought into contact with each other, subjected to a reduced pressure atmosphere of $2 \times 10^{-3}$ Pa, and bonded to each other by thermocompression bonding at 300° C. under a pressure of 100 kPa (10 N/cm$^2$). Next, first substrate 201 was removed by decomposing buffer layer 202 and part of first conductivity-type semiconductor layer 203 by applying laser light of 355 nm, from the back surface of first substrate 201 (step (H)). Thus, a wafer having the structure shown in FIG. 2(e) was obtained. Here, part of first substrate 201 was left on the surface of first conductivity-type semiconductor layer 203.

Next, part of first conductivity-type semiconductor layer 203 exposed by removing first substrate 201 and buffer layer 202 was removed by dry etching (step (I)). As a result, the bottom surface of the depression portion was exposed. Here, in addition to removal of part of first conductivity-type semiconductor layer 203, projections and depressions were formed on the surface of first conductivity-type semiconductor layer 203. As a result of this step, the semiconductor layer part including first conductivity-type semiconductor layer 203, emission layer 204 and second conductivity-type semiconductor layer 207 was discontinuous at 350 μm pitches.

Next, Ti 15 nm and Al 100 nm were deposited as first electrode 216 in the vicinity of the middle of the surface of first conductivity-type semiconductor layer 203, and Ti 15 nm and Al 200 nm were deposited as second electrode 217 on that surface of second substrate 213 which was opposite to the surface on which first ohmic layer 214 was formed, resulting in a wafer having a structure shown in FIG. 2(f). Finally, at the portions where insulating layer 208 was exposed at 350 μm pitches, (the position indicated by the dotted line in FIG. 2(f)), the above-noted wafer was divided by a diamond scribing method (step (F)), resulting in a nitride semiconductor light emitting device.

Example 2

A nitride semiconductor light emitting device was fabricated by the following method. For convenience of explanation, the description will be made with reference to FIG. 4. Until reflection layer 410 was formed in step (E), the process was performed similarly to Example 1. Then, Au was deposited at a thickness of 200 nm as plating underlying layer 411, as shown in FIG. 4(a). Next, as shown in FIG. 4(a), using an electroless plating method, Ni was formed at a thickness of 70 μm as second substrate 412 on plating underlying layer 411.

Next, first substrate 401 was removed by decomposing buffer layer 402 and part of first conductivity-type semiconductor layer 403 by applying laser light of 355 nm, from the back surface of first substrate 401 (step (H)). Here, part of first substrate 401 was left on the surface of first conductivity-type semiconductor layer 403.

Next, part of first conductivity-type semiconductor layer 403 exposed by removing first substrate 401 and buffer layer 402 was removed by dry etching (step (I)). As a result, the bottom surface of the depression portion was exposed. Here, in addition to removal of part of first conductivity-type semiconductor layer 403, projections and depressions were formed on the surface of first conductivity-type semiconductor layer 403. As a result of this step, the semiconductor layer part including first conductivity-type semiconductor layer 403, emission layer 404 and second conductivity-type semiconductor layer 407 was discontinuous at 350 μm pitches.

Next, Ti 15 nm and Al 100 nm were deposited as first electrode 413 in the vicinity of the middle of the surface of first conductivity-type semiconductor layer 403, resulting in a wafer having a structure shown in FIG. 4(b). Finally, at the portions where insulating layer 408 was exposed at 350 μm pitches, (the position indicated by the dotted line in FIG. 4(b)), the above-noted wafer was divided by a laser scribing method (step (F)), resulting in a nitride semiconductor light emitting device.

Example 3

A nitride semiconductor light emitting device was fabricated by the following method. For convenience of explanation, the description will be made with reference to FIG. 6. First, a sapphire substrate was prepared as first substrate 601. Then, 50 nm-thick buffer layer 602 made of $Al_rGa_{1-r}N$ ($0 \leq r \leq 1$), 5 μm-thick first conductivity-type semiconductor layer 603 as an n-type GaN layer, 100 nm-thick emission layer 604 including a barrier layer made of GaN and a well layer made of $In_qGa_{1-q}N$ ($0 \leq q \leq 1$), and second conductivity-type semiconductor layer 607 formed of 30 nm-thick p-type AlGaN layer 605 and 200 nm-thick p-type GaN layer 606 were grown in this order on first substrate 601 according to the usual manner (step (A)). Next, Pd of 1.5 nm was deposited as second metal layer 608 on the entire surface of second conductivity-type semiconductor layer 607 (step (G)).

Next, after an approximately square photoresist, 250 μm per side, was formed at a 350 μm pitch, second metal layer 608 at the exposed part was etched with an etching liquid including mixture of hydrochloric acid, nitric acid and water at a ratio of 1:9:5 (volume ratio). Here, second metal layer 608 was overetched about 5 μm inside from the end portion of the photoresist mask of 250 μm with the etching temperature of about 30° C. and an etching time of 30 seconds.

Next, using the photoresist mask used in the etching of second metal layer 608 as it is, for the part not covered with the photoresist, second conductivity-type semiconductor layer 607, emission layer 604 and first conductivity-type semiconductor layer 603 were removed by dry etching whereby a plurality of depression portions each in the shape of an inversed trapezoid were formed at approximately regular intervals corresponding to the regular pitches of the photoresist mask (step (B)). The depth of the depression portion was 4 μm from that surface of emission layer 604 on which first conductivity-type semiconductor layer 603 was formed.

Next, after removal of the photoresist, an $SiO_2$ layer was formed as insulating layer 609 to continuously cover the entire surface, namely, the surface of second metal layer 608, the side surfaces of second conductivity-type semiconductor layer 607, emission layer 604 and first conductivity-type semiconductor layer 603 exposed in step (B) corresponding to the side wall of the depression portion, and the surface of first conductivity-type semiconductor layer 603 exposed in step (B) corresponding to the bottom surface of the depression portion (step (C)). Then, part of insulating layer 609 formed on the surface of second metal layer 608 was removed by etching to expose part of the surface of second metal layer 608 (step (D)). Here, second metal layer 608 functions as an etching stop layer.

Then, step (E) was performed in which a first metal layer and a second substrate were stacked in this order on the entire exposed surface, that is, on insulating layer 609 and on the exposed, second metal layer 608. In this step, first, as shown in FIG. 6(a), an AgNd layer was formed at a thickness of 100 nm as reflection layer 610 by sputtering on insulating layer 609 and on the exposed second metal layer 608. Then, an NiTi layer was formed at a thickness of 15 nm as diffusion barrier layer 611 by sputtering. Then, Au of 1 μm was deposited as first eutectic bonding layer 612.

Next, as shown in FIG. 6(a), a 10 nm-thick Ti layer and then a 200 nm-thick Au layer were formed as first ohmic layer 614 according to the usual manner on second substrate 613 which was an Si substrate, and AuSn of 1 μm was thereafter deposited thereon as second eutectic bonding layer 615.

Next, first eutectic bonding layer 612 and second eutectic bonding layer 615 were brought into contact and bonded to each other by thermocompression bonding, similarly to Example 1. Next, first substrate 601 was removed by decomposing buffer layer 602 and part of first conductivity-type semiconductor layer 603 by applying laser light of 355 nm, from the back surface of first substrate 601 (step (H)). Here, part of first substrate 601 was left on the surface of first conductivity-type semiconductor layer 603.

Next, part of first conductivity-type semiconductor layer 603 exposed by removing first substrate 601 and buffer layer 602 was removed by dry etching (step (I)). As a result, the bottom surface of the depression portion was exposed. Here, in addition to removal of part of first conductivity-type semiconductor layer 603, projections and depressions were formed on the surface of first conductivity-type semiconductor layer 603. As a result of this step, the semiconductor layer part including first conductivity-type semiconductor layer 603, emission layer 604 and second conductivity-type semiconductor layer 607 was discontinuous at 350 μm pitches.

Next, Ti 15 nm and Al 100 mm were deposited as first electrode 616 for external connection in the vicinity of the middle of the surface of first conductivity-type semiconductor layer 603, and Ti 15 nm and Al 200 nm were deposited as second electrode 617 for external connection on that surface of second substrate 613 which was opposite to the surface on which first ohmic layer 614 was formed, resulting in a wafer having a structure shown in FIG. 6(b). Finally, at the portions where insulating layer 609 was exposed at 350 μm pitches, (the position indicated by the dotted line in FIG. 6(b)), the above-noted wafer was divided by a diamond scribing method (step (F)), resulting in a nitride semiconductor light emitting device.

Example 4

A nitride semiconductor light emitting device was fabricated by the following method. For convenience of explanation, the description will be made with reference to FIG. 9. Until reflection layer 910 was formed in step (E), the process was performed similarly to Example 3. Then, Au was deposited at a thickness of 200 nm as plating underlying layer 911, as shown in FIG. 9(a). Next, as shown in FIG. 9(a), using an electroless plating method, Ni was formed at a thickness of 70 μm as second substrate 912 on plating underlying layer 911.

Next, first substrate 901 was removed by decomposing buffer layer 902 and part of first conductivity-type semiconductor layer 903 by applying laser light of 355 nm, from the back surface of first substrate 901 (step (H)). Here, part of first substrate 901 was left on the surface of first conductivity-type semiconductor layer 903.

Next, part of first conductivity-type semiconductor layer 903 exposed by removing first substrate 901 and buffer layer 902 was removed by dry etching (step (I)). As a result, the bottom surface of the depression portion was exposed. Here, in addition to removal of part of first conductivity-type semiconductor layer 903, projections and depressions were formed on the surface of first conductivity-type semiconductor layer 903. As a result of this step, the semiconductor layer part including first conductivity-type semiconductor layer 903, emission layer 904 and second conductivity-type semiconductor layer 907 was discontinuous at 350 μm pitches.

Next, Ti 15 nm and Al 100 nm were deposited as first electrode 913 for external connection in the vicinity of the middle of the surface of first conductivity-type semiconductor layer 903, resulting in a wafer having a structure shown in FIG. 9(b). Finally, at the portions where insulating layer 909 was exposed at 350 μm pitches, (the position indicated by the dotted line in FIG. 9(b)), the above-noted wafer was divided by a laser scribing method (step (F)), resulting in a nitride semiconductor light emitting device.

Example 5

A nitride semiconductor light emitting device was fabricated by the following method. For convenience of explanation, the description will be made with reference to FIG. 10. FIG. 10 is a schematic process view illustrating the method in this example. First, a sapphire substrate was prepared as a first substrate 1001. Then, a 50 nm-thick buffer layer 1002 made of $Al_rGa_{1-r}N$ ($0 \leq r \leq 1$), an 5 μm-thick n-type GaN layer as a first conductivity-type semiconductor layer 1003, a 100 nm-thick emission layer 1004 including a barrier layer made of GaN and a well layer made of $In_qGa_{1-q}N$ ($0 \leq q \leq 1$), and a second conductivity-type semiconductor layer 1007 formed of a 30 nm-thick p-type AlGaN layer 1005 and a 200 nm-thick p-type GaN layer 1006 were grown in this order on first substrate 1001 according to the usual manner (step (A)).

Next, a current blocking layer 1015 formed of Ti with a diameter of 100 μm and a thickness of 100 nm was formed on p-type GaN layer 1006 at 350 μm pitch. Ti serves as Schottky contact with p-type GaN layer 1006. Then, Pd of 1.5 nm was deposited as a second metal layer 1008 on the entire surface, and thereafter an AgNd layer was formed at a thickness of 100 nm as second metal layer 1008 by sputtering (step (G)). Here, the Pd layer forms ohmic junction with p-type GaN layer 1006. The AgNd layer is a reflection layer. Then, a thermal treatment at 500° C. for three minutes under a highly reduced pressure was performed for alloying with a semiconductor layer formed of first conductivity-type semiconductor layer 1003, emission layer 1004 and second conductivity-type semiconductor layer 1007, thereby forming ohmic contact.

Next, an approximately square photoresist mask, 250 μm per side, was formed at a 350 μm pitch. Here, the current blocking layer was arranged to be approximately in the center of the approximate square of 250 μm. Thereafter, the aforementioned AgNd layer at the exposed part was etched with an etching liquid including acetic acid to expose the Pd layer under the AgNd layer. Here, the AgNd layer was overetched inside from the photoresist mask end portion.

Then, the Pd layer at the exposed portion was etched by an etching liquid including mixture of hydrochloric acid, nitric acid and water at a ratio of 1:9:5 (volume ratio). Here, the Pd layer was overetched about 5 μm inside from the end portion of the photoresist mask of 250 μm with the etching temperature of about 30° C. and an etching time of 30 seconds.

Next, using the photoresist mask used in the etching of second metal layer 1008 as it is, for the part not covered with the photoresist, second conductivity-type semiconductor layer 1007, emission layer 1004 and first conductivity-type semiconductor layer 1003 were removed by dry etching whereby a plurality of depression portions each in the shape of an inversed trapezoid were formed at approximately regular intervals corresponding to the regular pitches of the photoresist mask (step (B)). The depth of the depression portion was 4 μm from that surface of emission layer 1004 on which first conductivity-type semiconductor layer 1003 was formed.

Next, after removal of the photoresist, an $SiO_2$ layer was formed as an insulating layer 1009 to continuously cover the entire surface, namely, the surface of the AgNd layer, the side surface of the AgNd layer, the side surface of the Pd layer, the side surfaces of second conductivity-type semiconductor layer 1007, emission layer 1004 and first conductivity-type semiconductor layer 1003 exposed in step (B) corresponding to the side wall of the depression portion, and the surface of first conductivity-type semiconductor layer 1003 exposed in step (B) corresponding to the bottom surface of the depression portion (step (C)). Then, part of insulating layer 1009 formed on the surface of second metal layer 1008 was removed by etching using hydrofluoric acid to expose part of the AgNd layer (step (D)). A photoresist mask was used in the etching. Here, the AgNd layer functions as an etching stop layer.

Then, the photoresist mask for etching was removed, and a photoresist mask having approximately square holes, 300 μm per side, at 350 μm pitches was formed in order to partially form a first metal layer by lift-off. Here, the center of the approximately square hole was matched with the center of the above-noted AgNd layer having a width of about 250 μm.

Then, step (E) was performed in which a first metal layer and a second substrate were stacked in this order on the entire exposed surface, that is, on insulating layer 1009 and on the exposed second metal layer 1008. In this step, first, as shown in FIG. 10(a), an NiTi layer was formed at a thickness of 15 nm as a diffusion barrier layer 1010 by sputtering on insulating layer 1009 and on the exposed second metal layer 1008. Then, Au of 1 μm was deposited as a first eutectic bonding layer 1011. Thereafter, a square first metal layer 300 μm per side was formed by lift-off.

Next, as shown in FIG. 10(a), an Si substrate as a second substrate 1012 was prepared, and after a photoresist mask having a square hole of 300 μm per side was formed, a 10 nm-thick Ti layer and then a 200 nm-thick Au layer were formed as a first ohmic layer 1013 on second substrate 1012. AuSn of 1 μm was thereafter deposited thereon as a second eutectic bonding layer 1014. Then, a square 300 μm per side was formed by lift-off.

Next, first eutectic bonding layer 1011 and second eutectic bonding layer 1014 patterned in squares were aligned and brought into contact to overlap with each other and bonded to each other by thermocompression bonding, similarly to Example 1. Next, first substrate 1001 was removed by decomposing buffer layer 1002 and part of first conductivity-type semiconductor layer 1003 by applying laser light of 355 nm, from the back surface of first substrate 1001 (step (H)). Here, part of first substrate 1001 was left on the surface of first conductivity-type semiconductor layer 1003.

Next, projections and depressions were formed on the surface of first conductivity-type semiconductor layer 1003 exposed by removing first substrate 1001 and buffer layer 1002, by dry etching. Next, Ti 15 nm and Al 100 nm were deposited as a first electrode 1016 for external connection in the vicinity of the middle of the surface of first conductivity-type semiconductor layer 1003, and Ti 15 nm and Al 200 nm were deposited as a second electrode 1017 for external connection on that surface of second substrate 1012 which was opposite to the surface on which first ohmic layer 1013 was formed, resulting in a wafer having a structure shown in FIG. 10(b). Finally, at portions where the devices are partially separated at 350 μm pitches (the position indicated by the dotted line in FIG. 10(b)), the above-noted wafer was divided into chips by a diamond scribing method (step (F)), resulting in a nitride semiconductor light emitting device.

Example 6

A nitride semiconductor light emitting device was fabricated by the following method. For convenience of explanation, the description will be made with reference to FIG. 6. First, the process was performed similarly to Example 3, up to step (G), and second metal layer 608 was etched. Next, using the photoresist mask used in the etching of second metal layer 608 as it is, for the part not covered with the photoresist, second conductivity-type semiconductor layer 607, emission layer 604 and first conductivity-type semiconductor layer 603 were removed by dry etching whereby a plurality of depression portions each in the shape of an inversed trapezoid were formed at approximately regular intervals corresponding to the regular pitches of the photoresist mask (step (B)). The depth of the depression portion was 4.8 μm from that surface of emission layer 604 on which first conductivity-type semiconductor layer 603 was formed. Thus, the distance from the bottom surface of the depression portion to that surface of first conductivity-type semiconductor layer 603 on which buffer layer 602 was formed was about 0.3 μm.

Next, steps (C)-(E) were performed by a similar method as in Example 3. Then, first substrate 601 was removed by decomposing buffer layer 602 and part of first conductivity-type semiconductor layer 603 by applying laser light of 355 nm, from the back surface of first substrate 601 (step (H)). Here, the laser light radiation allowed first substrate 601 to be removed, allowed part of first conductivity-type semiconductor layer 603 to be removed to expose the bottom surface of the depression portion, and in addition, allowed projections and depressions to be formed on the surface of first conductivity-type semiconductor layer 603.

Next, by a similar method as in Example 3, first electrode 616 and second electrode 617 were formed. Thereafter, at the portions where insulating layer 609 was exposed at 350 μm pitches, (the position indicated by the dotted line in FIG. 6(b)), the above-noted wafer was divided by a diamond scribing method (step (F)), resulting in a nitride semiconductor light emitting device. Such a method of fabricating a nitride semiconductor light emitting device allows the steps to be reduced and achieves high productivity.

Example 7

A nitride semiconductor light emitting device was fabricated by the following method. For convenience of explanation, the description will be made with reference to FIG. 11. FIG. 11 is a schematic process view illustrating the method of this example. First, a sapphire substrate was prepared as a first substrate 1101. Then, a 50 nm-thick buffer layer 1102 made of $Al_rGa_{1-r}N$ ($0 \leq r \leq 1$), a 5 μm-thick n-type GaN layer as a first conductivity-type semiconductor layer 1103, a 100 nm-thick emission layer 1104 including a barrier layer made of GaN and a well layer made of $In_qGa_{1-q}N$ ($0<q<1$), and a second conductivity-type semiconductor layer 1107 formed of a 30 nm-thick p-type AlGaN layer 1105 and a 200 nm-thick p-type GaN layer 1106 were grown in this order on first substrate 1101 according to the usual manner (step (A)).

Next, a second metal layer 1110 formed of an ohmic layer 1108 of Pd and a reflection layer 1109 of AgNd was formed on p-type GaN layer 1106 (step (G)). Specifically, Pd of 1.5 nm was deposited on the entire surface and thereafter Pd was partially etched using a photoresist mask so that portions without Pd, each with a length of 100 μm, were formed at 350 μm pitches. Then, an AgNd layer was formed at a thickness of 100 nm by sputtering. Then, a thermal treatment at 500° C. for three minutes under a highly reduced pressure was performed for alloying with a semiconductor layer formed of first conductivity-type semiconductor layer 1103, emission layer 1104 and second conductivity-type semiconductor layer 1107, thereby forming ohmic contact.

Here, both Pd and AgNd are metals that form ohmic junction with p-type GaN layer 1106. The contact resistance is about 0.002 $\Omega cm^2$ in a case of Pd and is about 0.01-0.1 $\Omega cm^2$ in a case of AgNd, and AgNd is more than one digit higher in constant resistance than Pd. Therefore, in the portion where Pd is etched away, AgNd is in direct contact with p-type GaN layer 1106 and ohmic contact is achieved. However, since the contact resistance of Pd is lower, most current is injected from the part where Pd is present. Therefore, almost no current is injected from the region where AgNd is in direct contact with p-type GaN layer 1106. In other words, the region where Pd is not present acts as a current blocking portion.

Next, an approximately square photoresist mask, 250 μm per side, was formed at a 350 μm pitch. Here, the aforementioned current blocking portion was arranged to be in the approximately center of the approximate square of 250 μm. Then, the AgNd layer and the Pd layer at the exposed part were etched by an etching liquid including acetic acid and nitric acid. Since AgNd and Pd were alloyed, both of them can be etched in one-time etching. Here, the AgNd layer (reflection layer 1109) and the Pd layer (ohmic layer 1108) were overetched inside from the photoresist mask end portion. This leads to further reduction of leak current and improvement of yield.

Next, using the photoresist mask used in the etching of second metal layer 1110 as it is, for the part not covered with the photoresist, second conductivity-type semiconductor layer 1107, emission layer 1104 and first conductivity-type semiconductor layer 1103 were removed by dry etching whereby a plurality of depression portions each in the shape of an inversed trapezoid were formed at approximately regular intervals corresponding to the regular pitches of the photoresist mask (step (B)). The depth of the depression portion was 4 µm from that surface of emission layer 1104 on which first conductivity-type semiconductor layer 1103 was formed.

Next, after removal of the photoresist, an $SiO_2$ layer was formed as an insulating layer 1111 to continuously cover the entire surface, namely, the surface of the AgNd layer, the side surface of the AgNd layer, the side surface of the Pd layer, the side surfaces of second conductivity-type semiconductor layer 1107, emission layer 1104 and first conductivity-type semiconductor layer 1103 exposed in step (B) corresponding to the side wall of the depression portion, and the surface of first conductivity-type semiconductor layer 1103 exposed in step (B) corresponding to the bottom surface of the depression portion (step (C)). Then, part of insulating layer 1111 formed on the surface of second metal layer 1110 was removed by etching using hydrofluoric acid to expose part of the AgNd layer (reflection layer 1109) (step (D)). A photoresist mask was used in the etching. Here, the AgNd layer (reflection layer 1109) functions as an etching stop layer. The hole formed in insulating layer 1111 had a diameter of 100 µm and was formed generally directly above the aforementioned current blocking portion. Insulating layer 1111 thus formed also functions as a diffusion barrier layer and is not mixed with the first metal layer formed in the subsequent step in the portion other than the above-noted 100 µm hole, thereby preventing reduction in reflectivity.

Then, the photoresist mask for etching was removed, and a photoresist mask having approximately square holes, 300 µm per side, at 350 µm pitches was formed in order to partially form a first metal layer by lift-off. Here, the center of the approximately square hole was matched with the center of the above-noted current blocking portion.

Then, step (E) was performed in which a first metal layer and a second substrate were stacked in this order on the entire exposed surface, that is, on insulating layer 1111 and on the exposed second metal layer 1110. In this step, first, as shown in FIG. 11(*a*), Au of 1 µm was deposited as a first eutectic bonding layer 1112 on insulating layer 1111 and on the exposed second metal layer 1110. Thereafter, a square first metal layer, 300 µm per side, was formed by lift-off.

Next, as shown in FIG. 11(*a*), an Si substrate as a second substrate 1113 was prepared, and after a photoresist mask having a square hole of 300 µm per side was formed, a 10 nm-thick Ti layer and then a 200 nm-thick Au layer were formed as a first ohmic layer 1114 on second substrate 1113. AuSn of 1 µm was thereafter deposited thereon as a second eutectic bonding layer 1115. Then, a square 300 µm per side was formed by lift-off.

Next, first eutectic bonding layer 112 and second eutectic bonding layer 1115 patterned in squares were aligned and brought into contact to overlap with each other, subjected to a vacuum atmosphere, and bonded to each other by thermocompression bonding, at 300° C. under a pressure of 100 kPa (10 N/cm$^2$). Next, first substrate 1101 was removed by decomposing buffer layer 1102 and part of first conductivity-type semiconductor layer 1103 by applying laser light of 355 nm, from the back surface of first substrate 1101 (step (H)).

Next, projections and depressions were formed on the surface of first conductivity-type semiconductor layer 1103 exposed by removing first substrate 1101 and buffer layer 1102, by dry etching. Next, Ti 15 nm and Al 100 nm were deposited as a first electrode 116 for external connection in the vicinity of the middle of the surface of first conductivity-type semiconductor layer 1103, and Ti 15 nm and Al 200 nm were deposited as a second electrode 1117 for external connection on that surface of second substrate 1113 which was opposite to the surface on which first ohmic layer 1114 was formed, resulting in a wafer having a structure shown in FIG. 11(*b*). Finally, at the portions where the devices are partially separated at 350 µm pitches (the position indicated by the dotted line in FIG. 11(*b*)), the above-noted wafer was divided into chips by a diamond scribing method (step (F)), resulting in a nitride semiconductor light emitting device.

In the device in this example, the insulating layer also functions as a diffusion barrier layer, so that the diffusion barrier function was improved, the reflectivity was improved to 97%, and the light extraction efficiency was improved to 80%. In addition, since the insulating layer also functions as a diffusion barrier layer, diffusion did not occur at all in the region coated with the insulating layer in a long-term reliability test, and a reliable device was obtained.

Example 8

A nitride semiconductor light emitting device was fabricated by the following method. FIG. 12 is a schematic process view illustrating the method of this example. First, a sapphire substrate was prepared as a first substrate 1201. Then, a 50 nm-thick buffer layer 1202 made of $Al_rGa_{1-r}N$ ($0 \leq r \leq 1$), a 5 µm-thick n-type GaN layer as a first conductivity-type semiconductor layer 1203, a 100 nm-thick emission layer 1204 including a barrier layer made of GaN and a well layer made of $In_qGa_{1-q}N$ ($0<q<1$), and a second conductivity-type semiconductor layer 1207 formed of a 30 nm-thick p-type AlGaN layer 1205 and a 200 nm-thick p-type GaN layer 1206 were grown in this order on first substrate 1201 according to the usual manner (step (A)).

Next, a second metal layer 1211 formed of an ohmic layer 1208 of Pd, a first reflection layer 1209 of AgNd and an adhesion layer 1210 of NiTi was formed on p-type GaN layer 1206 (step (G)). Specifically, Pd of 1.5 nm was deposited on the entire surface and thereafter Pd was partially etched using a photoresist mask so that portions without Pd each with a length of 100 µm were formed at 350 µm pitches. Then, an AgNd layer having a thickness of 100 nm and then an NiTi layer having a thickness of 3.3 nm were formed by sputtering. Then, a thermal treatment at 500° C. for three minutes under a highly reduced pressure was performed for alloying with a semiconductor layer formed of second conductivity-type semiconductor layer 1207, thereby forming ohmic contact. Here, both Pd and AgNd are metals that form ohmic junction with p-type GaN layer 1206. The contact resistance is about 0.002 $\Omega cm^2$ in a case of Pd and is about 0.01-0.1 $\Omega cm^2$ in a case of AgNd, and AgNd is more than one digit higher in constant resistance than Pd. Therefore, in the portion where Pd is etched away, AgNd is in direct contact with p-type GaN layer 1206 and ohmic contact is achieved. However, since the contact resistance of Pd is lower, most current is injected from the part where Pd is present. Therefore, almost no current is injected from the region where AgNd is in direct contact with p-type GaN layer 1206. In other words, the region where Pd is not present acts as a current blocking portion.

Next, an approximately square photoresist mask, 250 µm per side, was formed at a 350 µm pitch. Here, the aforementioned current blocking portion was arranged to be in the approximately center of the approximate square of 250 µm. Then, the NiTi layer, the AgNd layer and the Pd layer at the exposed part were etched by an etching liquid including acetic acid and nitric acid. Since NiTi, AgNd and Pd were alloyed, both of them can be etched in one-time etching. Here, the etching was performed in such a manner that the NiTi layer (adhesion layer 1210), the AgNd layer (first reflection layer 1209) and the Pd layer (ohmic layer 1208) were not overetched inside from the photoresist mask end portion.

Next, the photoresist mask used in the etching of the aforementioned second metal layer 1211 was removed, and an approximately square photoresist mask, 270 µm per side, was formed at a 350 µm pitch. Here, the aforementioned second metal layer 1211 was arranged to be in the approximately center of the approximate square of 270 µm. In this manner, the resist mask can be formed to completely cover the second metal layer without overetching second metal layer 1211 by forming the resist mask again. This prevents silver scattering by dry etching which would result in leak. In addition, reduction in an electrode size can be prevented by not performing overetching, and accordingly, reduction of an injection area can be prevented. Therefore, the increased current injection density and reduction in emission efficiency can be prevented.

Next, for the part not covered with the photoresist, second conductivity-type semiconductor layer 1207, emission layer 1204 and first conductivity-type semiconductor layer 1203 were removed by dry etching whereby a plurality of depression portions each in the shape of an inversed trapezoid were formed at approximately regular intervals corresponding to the regular pitches of the photoresist mask (step (B)). The depth of the depression portion was 4 µm from that surface of emission layer 1204 on which first conductivity-type semiconductor layer 1203 was formed.

Next, after removal of the photoresist, an $SiO_2$ layer was formed as a first insulating layer 1212 to continuously cover the entire surface, namely, the surface of the NiTi layer, the side surface of the NiTi layer, the side surface of the AgNd layer, the side surface of the Pd layer, the side surfaces of second conductivity-type semiconductor layer 1207, emission layer 1204 and first conductivity-type semiconductor layer 1203 exposed in step (B) corresponding to the side wall of the depression portion, and the surface of first conductivity-type semiconductor layer 1203 exposed in step (B) corresponding to the bottom surface of the depression portion (step (C)). Then, part of first insulating layer 1212 formed on the surface of second metal layer 1211 was removed by etching using hydrofluoric acid to expose part of the NiTi layer (adhesion layer 1210) (step (D)). A photoresist mask was used in the etching. Here, the NiTi layer (adhesion layer 1210) functions as an etching stop layer. The hole formed in first insulating layer 1212 had a diameter of 90 µm and was formed generally directly above the aforementioned current blocking portion. First insulating layer 1212 thus formed also functions as a diffusion barrier layer and is not mixed with the first metal layer formed in the subsequent step in the portion other than the above-noted 90 µm hole, thereby preventing reduction in reflectivity. By making the diameter of the hole formed in first insulating layer 1212 smaller than the size 100 µm of the current blocking portion, the hole of the insulating layer can be placed within the current blocking portion even in the event of misalignment of photolithography, so that the region where reflectivity is reduced by metal diffusion can be placed within the region where emission does not take place. Thus, reduction of emission efficiency can be prevented.

Then, the photoresist mask for etching was removed, and NiTi 3.3 nm, AgNd 300 nm, NiTi 3.3 nm were formed as a second reflection layer 1213 by sputtering on first insulating layer 1212 and on the exposed second metal layer 1211. Then, $SiO_2$ of 0.3 µm was formed as a second insulating layer 1214. Thereafter, part of second insulating layer 1214 was removed by etching using hydrofluoric acid to expose part of the NiTi layer of second reflection layer 1213. A photoresist mask was used in the etching. Here, the NiTi layer functions as an etching stop layer. The hole formed in second insulating layer 1214 had a diameter of 90 µm and was formed generally directly above the aforementioned current blocking portion. Second insulating layer 1214 thus formed also functions as a diffusion barrier layer and is not mixed with the first metal layer formed in the subsequent step in the portion other than the above-noted 90 µm hole, thereby preventing reduction in reflectivity. By making the diameter of the hole formed in second insulating layer 1214 smaller than the size 100 µm of the current blocking portion, the hole of the second insulating layer 1214 can be placed within the current blocking portion even in the event of misalignment of photolithography, so that the region where reflectivity is reduced by metal diffusion can be placed within the region where emission does not take place. Thus, reduction of emission efficiency can be prevented.

Next, the photoresist mask for etching was removed, and Au of 100 nm was deposited as a first metal layer 1215 on second insulating layer 1214 and on the exposed second reflection layer 1213. This first metal layer 1215 also functions as a plating underlying layer. Then, a Cu layer was formed at a thickness of 100 µm as a second substrate 1216 by electrolytic plating (step (E), see FIG. 12(*a*)).

Next, first substrate 1201 was removed by decomposing buffer layer 1202 and part of first conductivity-type semiconductor layer 1203 by applying laser light of 355 nm, from the back surface of first substrate 1201 (step (H)). Next, projections and depressions were formed on the surface of first conductivity-type semiconductor layer 1203 exposed by removing first substrate 1201 and buffer layer 1202, by dry etching. In formation of projections and depressions, in addition to a natural forming technique such as dry etching or wet etching, a dry etching technique using a micro-processing mask using a stepper or nanoimprint may be used.

Next, Ti 15 nm and Al 100 nm were deposited as a first electrode 1217 for external connection in the vicinity of the middle of the surface of first conductivity-type semiconductor layer 1203, resulting in a wafer having a structure shown in FIG. 12(*b*). Second substrate 1216 of Cu functions as a second electrode for external connection. Finally, at the portions where the devices are partially separated at 350 µm pitches (the position indicated by the dotted line in FIG. 12(*b*)), the above-noted wafer was divided into chips by a diamond scribing method (step (F)), resulting in a nitride semiconductor light emitting device.

Figure 13:
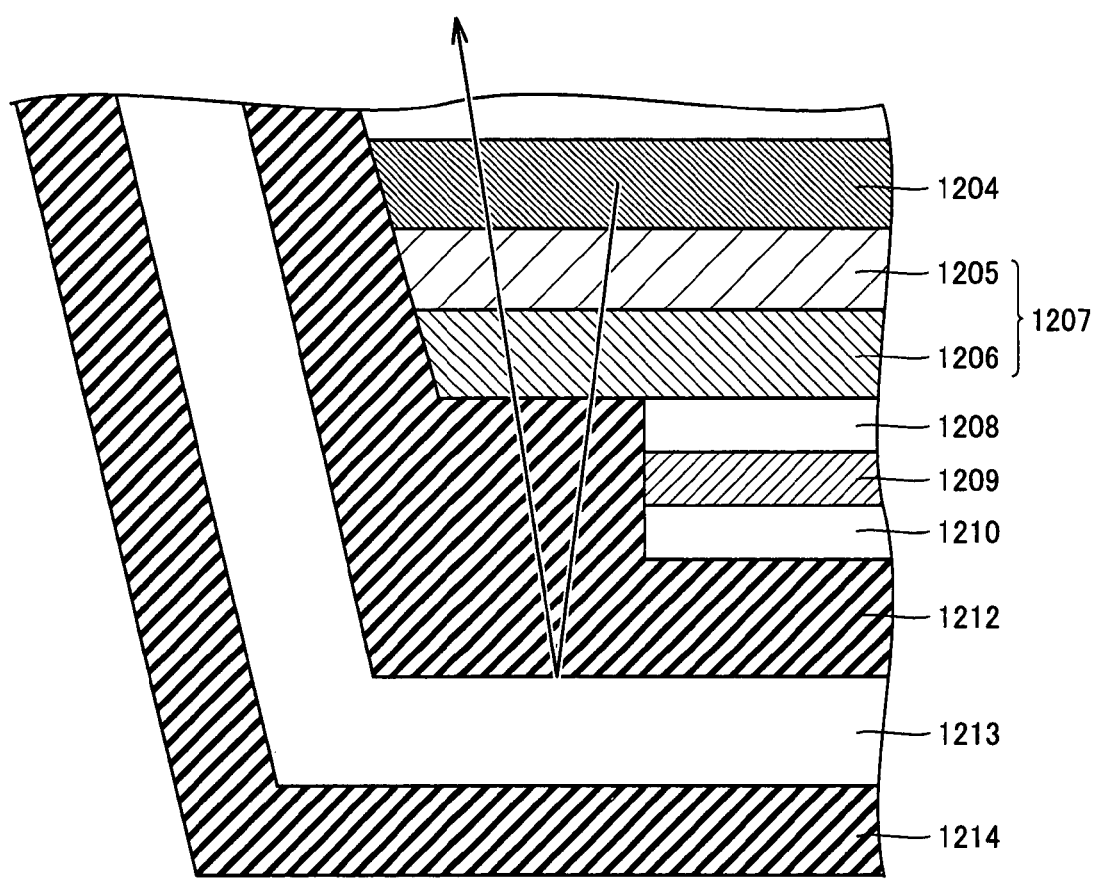
FIG. 13 is a schematic cross-sectional view showing a partially enlarged wafer shown in FIG. 12(b).
Figure 15:
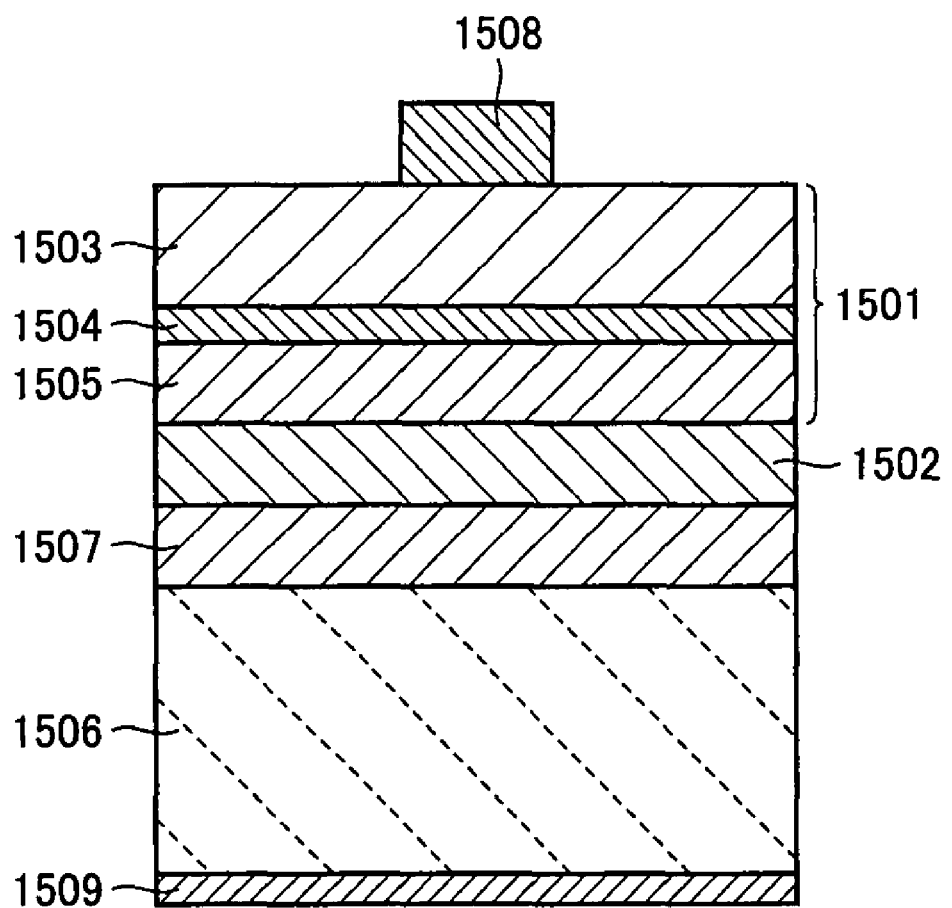
FIG. 15 is a schematic cross-sectional view showing an example of a conventional nitride semiconductor light emitting device.

In the device in this example, since second reflection layer 1213 is formed, light that cannot be reflected by first reflection layer 1209, as shown by the arrow in FIG. 12(*b*) and the arrow in FIG. 13, can be reflected by second reflection layer 1213. FIG. 13 is a schematic cross-sectional view showing a partially enlarged wafer shown in FIG. 12(*b*). As shown in FIG. 13, in the region where first reflection layer 1209 is not formed and the surface of second conductivity-type semiconductor layer 1207 is in contact with first insulating layer 1212, light emitted from emission layer 1204 transmits through first insulating layer 1212. However, provision of second reflection layer 1213 allows such light to be reflected. In addition, since second insulating layer 1214 also functions as a diffusion barrier layer, the diffusion barrier function can be improved. According to the device in this example, the reflectivity was improved to 97% in the entire device and the light extraction efficiency was improved to 85%. In addition, since the insulating layer also functions as a diffusion barrier layer, diffusion does not occur at all in the region coated with the insulating layer in a long-term reliability test, and a reliable device was obtained.

Example 9

A nitride semiconductor light emitting device was fabricated by the following method. FIG. 14 is a schematic process view illustrating the method of this example. First, a sapphire substrate was prepared as a first substrate 1401. Then, a 50 nm-thick buffer layer 1402 made of Al$_r$Ga$_{1-r}$N (0≦r≦1), a 5 µm-thick n-type GaN layer as a first conductivity-type semiconductor layer 1403, a 100 nm-thick emission layer 1404 including a barrier layer made of GaN and a well layer made of I$_q$Ga$_{1-q}$N (0≦q≦1), and a second conductivity-type semiconductor layer 1407 formed of a 30 nm-thick p-type AlGaN layer 1405 and a 200 nm-thick p-type GaN layer 1406 were grown in this order on first substrate 1401 according to the usual manner (step (A)).

Next, a second metal layer 1411 formed of an ohmic layer 1408 of Pd, a reflection layer 1409 of AgNd and a plating underlying layer 1410 of NiTi was formed on p-type GaN layer 1406 (step (G)). Specifically, Pd of 1.5 nm was deposited on the entire surface and thereafter Pd was partially etched using a photoresist mask so that portions without Pd each with a length of 100 µm was formed at 350 nm pitches. Then, an AgNd layer having a thickness of 300 nm and then an NiTi layer having a thickness of 100 nm were formed by sputtering. Then, a thermal treatment at 500° C. for three minutes under a highly reduced pressure was performed for alloying with a semiconductor layer formed of second conductivity-type semiconductor layer 1407, thereby forming ohmic contact. The region where Pd was removed acts as a current blocking portion.

Next, an approximately square photoresist mask, 280 µm per side, was formed at a 350 µm pitch. Here, the aforementioned current blocking portion was arranged to be in the approximately center of the approximate square of 280 µm. Then, the NiTi layer, the AgNd layer and the Pd layer at the exposed part were etched by an etching liquid including acetic acid and nitric acid. Here, the NiTi layer (plating underlying layer 1410), the AgNd layer (reflection layer 1409) and the Pd layer (ohmic layer 1408) were overetched inside from the photoresist mask end portion. This leads to further reduction in leak current and improvement of yield.

Next, using the photoresist mask used in the etching of second metal layer 1411 as it is, for the portion not covered with the photoresist, second conductivity-type semiconductor layer 1407, emission layer 1404, and first conductivity-type semiconductor layer 1403 were removed by dry etching whereby a plurality of depression portions each in the shape of an inversed trapezoid were formed at approximately regular intervals corresponding to the regular pitches of the photoresist mask (step (B)). The depth of the depression portion was 4 µm from that surface of emission layer 1404 on which first conductivity-type semiconductor layer 1403 was formed.

Next, after removal of the photoresist, an SiO$_2$ layer was formed as an insulating layer 1412 to continuously cover the entire surface, namely, the surface of the NiTi layer, the side surface of the NiTi layer, the side surface of the AgNd layer, the side surface of the Pd layer, the side surfaces of second conductivity-type semiconductor layer 1407, emission layer 1404 and first conductivity-type semiconductor layer 1403 exposed in step (B) corresponding to the side wall of the depression portion, and the surface of first conductivity-type semiconductor layer 1403 exposed in step (B) corresponding to the bottom surface of the depression portion (step (C)). Then, part of insulating layer 1412 formed on the surface of second metal layer 1411 was removed by etching using hydrofluoric acid to expose a large part of the NiTi layer (plating underlying layer 1410) (step (D)). A photoresist mask was used in the etching. Here, the NiTi layer (plating underlying layer 1410) functions as an etching stop layer. The hole formed in insulating layer 1412 was formed like a quadrangle of 270 µm per side and had a center matched with the center of second metal layer 1411 of 280 µm.

Next, a Cu layer was formed at a thickness of 70 µm as a first metal layer 1416 by electroless plating (see FIG. 14(a)). The Cu layer was formed on the NiTi layer (plating underlying layer 1410) and the plating film extended laterally. Therefore, the region where the NiTi layer was exposed to be exposed to a plating liquid, which had been 270 µm on a side, became a square of generally 300 µn on a side because of the formation of the Cu layer. Here, the Cu layer can function as it is as a second substrate which is a conductive substrate. Furthermore, by using electroless plating, a Cu layer can selectively be formed on plating underlying layer 1410. When the Cu layer is used as a second substrate, the Cu plating surface was preferably plated with Ni of about 100 nm as an anticorrosion layer. In this example, a 100 nm-thick Ni layer was formed on the surface of the Cu layer by plating.

Next, first substrate 1401 was removed by decomposing buffer layer 1402 and part of first conductivity-type semiconductor layer 1403 by applying laser light of 355 nm, from the back surface of first substrate 1401 (step (H)). Next, projections and depressions were formed on the surface of first conductivity-type semiconductor layer 1403 exposed by removing first substrate 1401 and buffer layer 1402, by dry etching.

Next, Ti 15 nm and Al 100 nm were deposited as a first electrode 1417 for external connection in the vicinity of the middle of the surface of first conductivity-type semiconductor layer 1403, resulting in a wafer having a structure shown in FIG. 14(b). First metal layer 1416 of Cu functions as a second electrode for external connection. Finally, at the portions where the Cu layer is partially separated at 350 µm pitches (the position indicated by the dotted line in FIG. 14(b)), the above-noted wafer was divided into chips by a laser scribing method (step (F)), resulting in a nitride semiconductor light emitting device. Since the Cu layer was separated, chip division was easier.

In the nitride semiconductor light emitting devices of Examples 1-9 fabricated as describe above, the PN junction portion is coated with SiO$_2$, so that a source of leak current due to metal intrusion and the like can be reduced in the process of forming chips, thereby improving yield. In addition, a reliable device was fabricated which suffers less degradation with long-term power supply and does not suffer degradation even when used with large current. Moreover, since the nitride semiconductor layer has an inversely tapered structure, a device with improved light extraction efficiency and with high emission efficiency was obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride semiconductor light emitting device including a conductive substrate formed of a semiconductor material, a first metal layer, a second conductivity-type semiconductor layer, an emission layer, and a first conductivity-type semiconductor layer, in this order, wherein the nitride semiconductor light emitting device additionally has an insulating layer which covers at least side surfaces of said second conductivity-type semiconductor layer, said emission layer and said first conductivity-type semiconductor layer, wherein said first metal layer comprises a first surface that is a surface of a second ohmic layer, and a second surface that is disposed opposite the first surface and is a surface of a first ohmic layer, wherein the first surface of the first metal layer has a first portion facing said second conductivity-type semiconductor layer, and a second portion on which said insulating layer is disposed, wherein a first portion of a first surface of said second conductivity-type semiconductor layer does not have said insulating layer thereon and is in contact with said first portion of said first surface of said first metal layer, and wherein a second portion of the first surface of said second conductivity-type semiconductor layer is not in contact with said first surface of said first metal layer, and the insulating layer covers the second portion of said first surface of said second conductivity-type semiconductor layer.

2. The nitride semiconductor light emitting device according to claim 1, wherein said second portion of said first surface of said second conductivity-type semiconductor layer is 1-50% of the entire first surface of said second conductivity-type semiconductor layer.

3. The nitride semiconductor light emitting device according to claim 1, wherein said second conductivity-type semiconductor layer, said emission layer and said first conductivity-type semiconductor layer are an inversely tapered structure in the vicinity of an end portion of the device.

4. The nitride semiconductor light emitting device according to claim 1, wherein that surface of said first conductivity-type semiconductor layer which is opposite to a side in contact with said emission layer has projections and depressions.

5. The nitride semiconductor light emitting device according to claim 1, wherein the nitride semiconductor light emitting device has a first electrode formed on said first conductivity-type semiconductor layer and a second electrode formed on a surface of said conductive substrate which is opposite to a side in contact with said first metal layer.

6. The nitride semiconductor light emitting device according to claim 1, wherein said first metal layer includes at least one kind of layers selected from the group consisting of a eutectic bonding layer, a diffusion barrier layer, a reflection layer, and a plating underlying layer.

* * * * *